United States Patent
Hanson et al.

(10) Patent No.: US 6,529,054 B1
(45) Date of Patent: Mar. 4, 2003

(54) PREFETCH ARCHITECTURES FOR DATA AND TIME SIGNALS IN AN INTEGRATED CIRCUIT AND METHODS THEREFOR

(75) Inventors: David Russell Hanson, Brewster, NY (US); Gerhard Mueller, Wappingers Falls, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/425,329

(22) Filed: Oct. 22, 1999

Related U.S. Application Data

(60) Provisional application No. 60/119,976, filed on Feb. 12, 1999, and provisional application No. 60/119,905, filed on Feb. 12, 1999.

(51) Int. Cl.$^7$ .................................................. H03L 7/16
(52) U.S. Cl. ..................... 327/144; 327/154; 327/288; 327/294; 327/394; 375/354; 375/377
(58) Field of Search ..................... 375/354, 359, 375/377; 370/503, 516–518; 327/141, 144, 145, 152, 153, 154, 161, 288, 293, 294, 394, 399

(56) References Cited

U.S. PATENT DOCUMENTS

| | | | |
|---|---|---|---|
| 5,256,912 A | * 10/1993 | Rios | 327/144 |
| 5,259,006 A | * 11/1993 | Price et al. | 375/356 |
| 5,487,092 A | * 1/1996 | Finney et al. | 375/354 |
| 5,682,174 A | 10/1997 | Chiu | 345/84 |
| 5,696,722 A | 12/1997 | Yamauchi | 365/189.11 |
| 5,734,914 A | 3/1998 | Nakamura et al. | 395/750.01 |
| 5,774,001 A | * 6/1998 | Mozdzen et al. | 327/141 |
| 5,923,194 A | * 7/1999 | Graf, III | 327/144 |
| 5,963,075 A | * 10/1999 | Hiiragizawa | 327/295 |

FOREIGN PATENT DOCUMENTS

| | | |
|---|---|---|
| EP | 1028429 A2 | 8/2000 |
| WO | WO98/56004 | 10/1998 |

* cited by examiner

Primary Examiner—Stephen Chin
Assistant Examiner—Dac V. Ha
(74) Attorney, Agent, or Firm—Stanton Braden

(57) ABSTRACT

A synchronized data capture circuit configured to synchronize capturing of data in a first plurality of data signals with a first plurality of timing signals to output a synchronized data capture signal. The synchronized data capture circuit includes a timer generator having a first timer generator output. The timer generator is coupled to receive the first plurality of timing signals and to serially output on the first timer generator output, as a first high frequency timing pulse stream, first timing pulses responsive to timing pulses of the plurality of timing signals. The first high frequency timing pulse stream has a timing pulse stream frequency that is higher than a timing input frequency associated with one of the first plurality of timing signals. The synchronized data capture circuit also includes first plurality of data driver circuits coupled to receive the first plurality of data signals and the plurality of timing signals. The first plurality of data driver circuits are configured to serially output, as a first high frequency data stream, first data pulses responsive to the timing pulses of the plurality of timing signals and data pulses of the first plurality of data signal. The first high frequency data stream has a data stream frequency that is higher than a data input frequency associated with one of the first plurality of data signals. The synchronized data capture circuit further includes a first data clocking circuit coupled to receive the first high frequency data stream and the first high frequency timing pulse stream to synchronize capture of data in the first high frequency data stream using the first high frequency timing pulse stream to output the synchronized data capture signal, wherein the synchronized data capture signal has a data output frequency that is higher than the timing input frequency and the data input frequency.

47 Claims, 13 Drawing Sheets

PREFETCH ARCHITECTURES FOR DATA AND TIME SIGNALS IN AN INTEGRATED CIRCUIT AND METHODS THEREFOR

This application claims priority under 35 USC 119(e) of earlier filed provisional applications entitled "PREFETCH ARCHITECTURES FOR DATA AND TIMING SIGNALS IN AN INTEGRATED CIRCUIT AND METHODS THEREFOR", filed Feb. 12, 1999 (Application No. 60/119,976) and "SYNCHRONIZED DATA CAPTUREING CIRCUITS USING REDUCED VOLTAGE LEVELS AND METHODS THEREFOR", filed Feb. 12, 1999 (Application No. 60/119,905), both of which are incorporated by reference herein.

The following application is related to the present application and is incorporated by reference herein.

Application entitled "SYNCHRONIZED DATA CAPTURING CIRCUITS USING REDUCED VOLTAGE LEVELS AND METHODS THEREFOR" filed on Aug. 19, 1999 by inventors David Hanson and Gerhard Mueller, application No. 09/377,588.

BACKGROUND OF THE INVENTION

The present invention relates to circuits for synchronizing data capture in an integrated circuit. More particular, the present invention relates to circuits for synchronizing data capture and outputting the captured data at a significantly higher frequency than the frequency of the individual data lines and/or utilizes reduced voltage signals to reduce power consumption and to increase performance.

In any integrated circuit (IC), data signals often need to be transmitted from one circuit at one location on the IC to a receiving circuit at another location on the IC. As is well known by those skilled in the art, the data contained in the data signal is present in well defined data cycles, each of which has a finite period during which the data is valid for capture. Given that a data cycle is valid only for a limited period of time, it is crucial to ensure that the receiving circuit captures data during this relatively short period of time. This is particularly true in modern high speed IC's, which vastly reduce the duration of the data valid period, i.e., the time period during which data capturing must be performed.

To address the problem of properly capturing data at the receiving circuit during the limited time during which the data cycle is valid, timing or clock signals may be furnished to the receiving circuit. The use of a synchronized data capture circuit to synchronize data capture at the receiving circuit is well known. In general, if the timing signal tracks the data signal properly, the receiving circuit can depend on the timing information furnished in the timing signal to decide when to capture the data contained in the data signal.

To facilitate discussion, FIG. 1A illustrates a prior art circuit 100 for synchronizing data capture at a receiving circuit on the IC. Circuit 100 as shown includes a timing delay/driver 102, a data delay/driver 104, and a clocked data driver 106. A data signal 108 as shown at the input of the data delay/driver 104, which is clocked by a control signal 110, to produce a clocked data signal 112. The same control signal 110 also clocks timing delay/driver 102, producing a timing signal 114. Timing delay/driver 102 and data delay/driver 104 ensure that timing signal 114 properly tracks clocked data signal 112 for the specific IC on which circuit 100 is implemented to allow clocked data driver 106 to properly capture the data contained in clocked data signal 112 based on the timing information furnished by timing signal 114. The captured data as shown is outputted from clocked data driver 106 as output data 116 in FIG. 1A. The data synchronizing circuit of FIG. 1A is well known and will not be belabored further for the sake of brevity.

Although circuit 100 of FIG. 1A accomplishes the function of synchronizing data capture, there are significant disadvantages. By way of example, prior art data synchronizing circuit 100 generally synchronizes data capture at the speed of data transmission on the individual data lines (e.g., individual ones of data lines 108). In other words, data is captured and outputted from prior art data synchronizing circuit 100 of FIG. 1A at the relatively slow speed of data transmission on data lines 108. The speed of data transmission on data lines 108 is generally slow due to a couple of factors. For example, data on each individual data line 108 is typically obtained by reading from the array of storage cells, which operate at a relatively slow frequency compared to the frequency of the logic circuits which request the data from the memory array. Further, a given data line 108 in a typical dynamic random access memory circuit is typically long and heavily loaded, thereby severely limiting the speed at which data may be transmitted on an individual data line. Accordingly, unless the data synchronizing circuit is capable of capturing and outputting the data at a higher speed (i.e., substantially higher than the speed at which data is transmitted on individual data lines 108), device performance suffers due to the bottleneck between the higher speed logic circuits that request the stored data and the slower dynamic random access memory circuits that supply the data stored.

Another major disadvantage of the configuration shown in FIG. 1A relates to the fact prior art circuit 100 needs to operate with full swing signals (i.e., signals having the full rail-to-rail internal supply voltage swing of the IC) to perform synchronized data capture. More specifically, prior art circuit 100 is incapable of utilizing reduced voltage signals to perform the synchronized data capture task. As the term is employed herein, reduced voltage signals refer to signals whose amplitude is within a reduced voltage range, i.e., a voltage range that is lower than the full VDD internal supply voltage of the IC. In some cases, the reduced voltage level may be low enough (e.g., 1V) that it approaches the threshold voltage of the transistors (typically at around 0.7V or so). Since reduced voltage signals are useful in reducing circuit power consumption and/or improving performance, the inability of prior art circuit 100 to employ reduced voltage signals to perform its synchronized data capture task represents a serious shortcoming.

One reason underlying the inability of prior art circuit 100 to employ reduced voltage signals to perform synchronized data capture relates to one of its basic building block, the CMOS inverter. CMOS inverters are a basic building block of delay circuits, such as those present in timing/delay driver 102 and data delay/driver 104. To facilitate discussion, FIG. 1B depicts a simple CMOS inverter 150, which includes a p-FET transistor 152 coupled in series with an n-FET transistor 154 between VDD and ground.

Consider first the situation wherein a full swing signal is employed at the input of CMOS inverter 150: When input signal A at the input of CMOS inverter 150 is high at the VDD level, p-FET 152 is off and n-FET 154 is on, causing output signal B to be pulled to ground. Conversely, when input signal A at the input of CMOS inverter 150 is low at the ground level, p-FET 152 is on and n-FET 154 is off, causing output signal B to be pulled to VDD. In this case, CMOS inverter 150 functions correctly, albeit at a relatively high level of power consumption.

Now consider the situation wherein a reduced voltage signal is employed as an input signal A to CMOS inverter 150. If the reduced voltage signal is, for example, 1 Volt, a high input signal A not only causes n-FET 154 to be on as expected but also causes p-FET 152 to be softly on (i.e., not fully turning p-FET 152 off). In this case, the leakage current through p-PET 152 degrades the signal at the output of CMOS inverter 150, which may cause other circuits to misinterpret the logic level represented by output signal B of CMOS inverter 150. Furthermore, the leakage current through p-PET 152 to ground also causes CMOS inverter 150 to consume an unacceptable amount of power. Because of these issues and others, reduced voltage signals have not, to date, been employed in synchronized data capturing circuits to perform the synchronized data capture task.

As can be appreciated from the foregoing, there are desired synchronized data capturing circuits and methods therefore that can synchronize data capture at a substantially higher frequency than the frequency of the individual data lines and/or utilize reduced voltage signals to reduce power consumption and to increase performance.

SUMMARY OF THE INVENTION

The invention relates, in one embodiment, to a synchronized data capture circuit configured to synchronize capturing of data in a first plurality of data signals with a first plurality of timing signals to output a synchronized data capture signal. The synchronized data capture circuit includes a timer generator having a first timer generator output. The timer generator is coupled to receive the first plurality of timing signals and to serially output on the first timer generator output, as a first high frequency timing pulse stream, first timing pulses responsive to timing pulses of the plurality of timing signals. The first high frequency timing pulse stream has a timing pulse stream frequency that is higher than a timing input frequency associated with one of the first plurality of timing signals.

The synchronized data capture circuit also includes first plurality of data driver circuits coupled to receive the first plurality of data signals and the plurality of timing signals. The first plurality of data driver circuits are configured to serially output, as a first high frequency data stream, first data pulses responsive to the timing pulses of the plurality of timing signals and data pulses of the first plurality of data signal. The first high frequency data stream has a data stream frequency that is higher than a data input frequency associated with one of the first plurality of data signals.

The synchronized data capture circuit further includes a first data clocking circuit coupled to receive the first high frequency data stream and the first high frequency timing pulse stream to synchronize capture of data in the first high frequency data stream using the first high frequency timing pulse stream to output the synchronized data capture signal, wherein the synchronized data capture signal has a data output frequency that is higher than the timing input frequency and the data input frequency.

In another embodiment, the invention relates to a synchronized data capture circuit configured to synchronize capturing of data in a first plurality of data signals with a first plurality of timing signals to output a synchronized data capture signal. The synchronized data capture circuit includes a timer generator having a first timer generator output. The timer generator is coupled to receive the first plurality of timing signals and to serially output on the first timer generator output, as a first high frequency timing pulse stream, first timing pulses responsive to timing pulses of the plurality of timing signals. The first high frequency timing pulse stream has a timing pulse stream frequency that is higher than a timing input frequency associated with one of the first plurality of timing signals.

The synchronized data capture circuit also includes a first plurality of data driver circuits coupled to receive a first subset of data signals and the plurality of timing signals. The first subset of data signals represents a first subset of the first plurality of data signals. The first plurality of data driver circuits are configured to serially output, as a first high frequency data stream, first data pulses responsive to the timing pulses of the plurality of timing signals and data pulses of the first subset of data signals. The first high frequency data stream has a first data stream frequency that is higher than a data input frequency associated with one of the first plurality of data signals.

The synchronized data capture circuit further includes a second plurality of data driver circuits coupled to receive a second subset of data signals and the plurality of timing signals. The second subset of data signals represents a second subset of the first plurality of data signals. The second plurality of data driver circuits are configured to serially output, as a second high frequency data stream, second data pulses responsive to the timing pulses of the plurality of timing signals and data pulses of the second subset of data signals. The second high frequency data stream has a second data stream frequency that is higher than the data input frequency.

The synchronized data capture circuit additionally includes a first data clocking circuit coupled to receive the first high frequency data stream and the first high frequency timing pulse stream to synchronize capture of data in the first high frequency data stream using the first high frequency timing pulse stream to output first data capture signal. There is further included a second data clocking circuit coupled to receive the second high frequency data stream and the first high frequency timing pulse stream to synchronize capture of data in the second high frequency data stream using the first high frequency timing pulse stream to output second data capture signal in an interleaved manner with the first data capture signal, wherein the synchronized data capture signal is formed from the first data capture signal and the second data capture signal with pulses from the first data capture signal interleaved in time with pulses from the second data signal.

In yet another embodiment, the invention relates to a synchronized data capture circuit configured to synchronize capturing of data in a first plurality of data signals with a first plurality of timing signals to output a synchronized data capture signal. The synchronized data capture circuit includes a first timer generator having a first timer generator output. The first timer generator is coupled to receive a first subset of timing signals representing a first subset of the first plurality of timing signals, and to serially output on the first timer generator output, as a first high frequency timing pulse stream, first timing pulses responsive to timing pulses of the first subset of timing signals. The first high frequency timing pulse stream has a first timing pulse stream frequency that is higher than a timing input frequency associated with one of the first plurality of timing signals.

There is included a second timer generator having a second timer generator output. The second timer generator is coupled to receive a second subset of timing signals representing a second subset of the first plurality of timing signals, and to serially output on the second timer generator output, as a second high frequency timing pulse stream, second timing pulses responsive to timing pulses of the second subset of timing signals. The second high frequency timing pulse stream has a second timing pulse stream frequency that is higher than the timing input frequency, wherein pulses of the first high frequency timing pulse stream are interleaved in time with pulses of the second high frequency timing pulse stream.

There is further included a first plurality of data driver circuits coupled to receive a first subset of data signals and the plurality of timing signals. The first subset of data signals represents a first subset of the first plurality of data signals. The first plurality of data driver circuits are configured to serially output, as a first high frequency data stream, first data pulses responsive to the timing pulses of the plurality of timing signals and data pulses of the first subset of data signals. The first high frequency data stream has a first data stream frequency that is higher than a data input frequency associated with one of the first plurality of data signals.

There is additionally included a second plurality of data driver circuits coupled to receive a second subset of data signals and the plurality of timing signals. The second subset of data signals represents a second subset of the first plurality of data signals. The second plurality of data driver circuits are configured to serially output, as a second high frequency data stream, second data pulses responsive to the timing pulses of the plurality of timing signals and data pulses of the second subset of data signals. The second high frequency data stream has a second data stream frequency that is higher than the data input frequency.

Furthermore, there is included a first data clocking circuit coupled to receive the first high frequency data stream, the first high frequency timing pulse stream, and the second high frequency timing pulse stream to synchronize capture of data in the first high frequency data stream using the first high frequency timing pulse stream and the second high frequency timing pulse stream to output first data capture signal.

Additionally, there is included a second data clocking circuit coupled to receive the second high frequency data stream, the first high frequency timing pulse stream, and the second high frequency timing pulse stream to synchronize capture of data in the second high frequency data stream using the first high frequency timing pulse stream and the second high frequency timing pulse stream to output, in an interleaved manner with the first data capture signal, a second data capture signal, wherein the synchronized data capture signal is formed from the first data capture signal and the second data capture signal with pulses from the first data capture signal interleaved with pulses from the second data signal.

These and other features of the present invention will be described in more detail below in the detailed description of the invention and in conjunction with the following figures.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

Figure 1A:
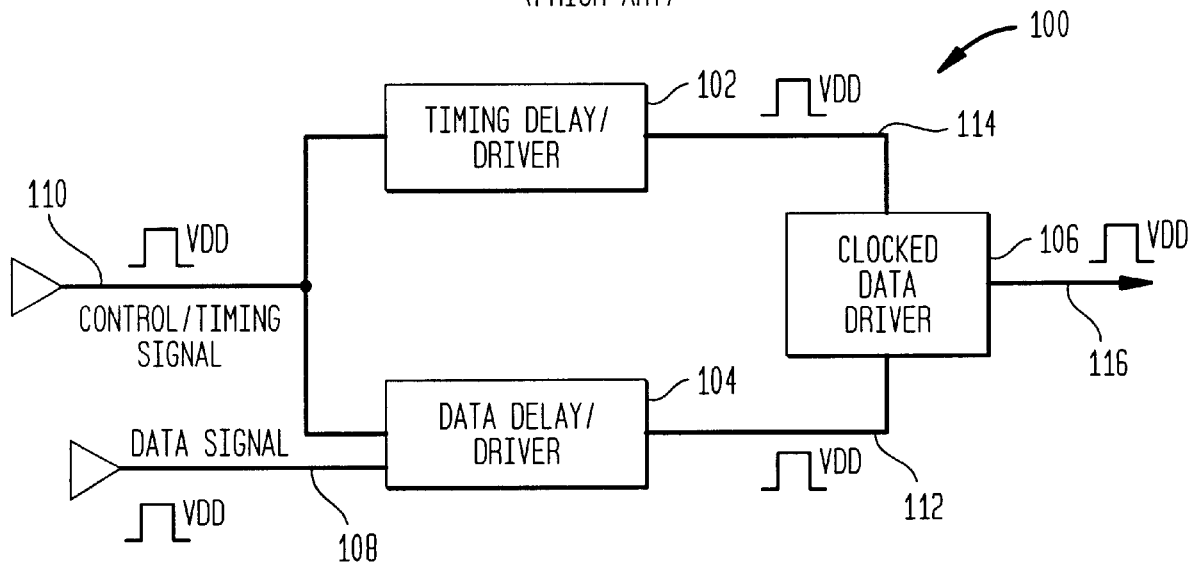
FIG. 1A illustrates, to facilitate discussion, a prior art circuit for synchronizing data capture at a receiving circuit on the IC.
Figure 1B:
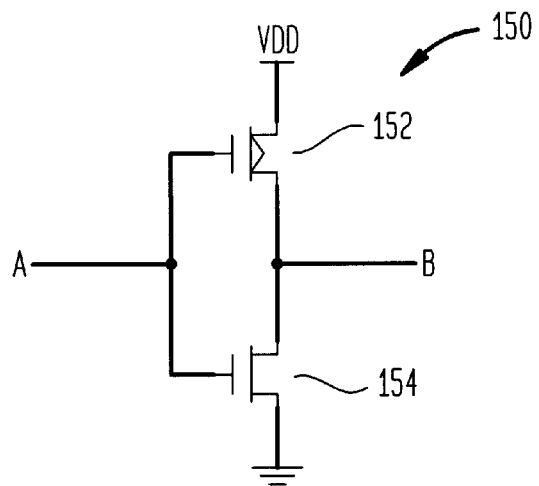
FIG. 1B depicts a standard CMOS inverter to facilitate discussion of the problems typically encountered when a reduced voltage data signal is employed in a standard CMOS inverter.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known structures and/or process steps have not been described in detail in order to not unnecessarily obscure the present invention.

In one embodiment, there is provided a synchronized data capture circuit that is capable of prefetching relatively low frequency data from individual data lines to permit synchronized data capture and outputting of the data to occur at a higher frequency. In one embodiment, the synchronized data capture circuit is also capable of being controlled by relatively low frequency timing signals from which a high frequency timing pulse stream is formed in order to perform synchronized data outputting on the high frequency stream of data that is prefetched from the relatively low frequency data lines. In this manner, it is possible to output synchronized capture data at a high frequency even when the data is received from relatively low frequency data lines and synchronized using timing pulses supplied through relatively low frequency timing signals.

In one embodiment, data prefetching is performed in a distributed manner. That is, data prefetching is first performed in parallel on multiple sets of relatively low frequency data lines to form a plurality of higher frequency streams of data. Each higher frequency stream of data represents the prefetched data from a set of relatively low frequency data lines. Data prefetching is again performed on the multiple higher frequency streams of data to output a stream of synchronized data that has an even higher frequency. By prefetching the data in a distributed manner, the invention renders it possible to advantageously tailor the operating frequency of the data lines connecting different circuit blocks to an optimum value.

Alternatively and/or additionally, the operation may be controlled by relatively low frequency timing pulses from which a high frequency timing pulse stream is formed in order to perform synchronized data capture. This is performed in parallel on multiple sets of relatively low frequency timing signal lines to form a plurality of higher frequency streams of timing pulses. The multiple streams of higher frequency timing pulses are aggregated at the data clocking circuit to form an even higher frequency stream of timing pulses to facilitate synchronized data capture on a high frequency data signal, which may have been prefetched from lower frequency data lines.

In one embodiment, the high frequency data streams are transmitted using reduced voltage signals to reduce power consumption and/or improve performance. Analogously, the high frequency timing pulse streams are also transmitted using reduced voltage signals, in one embodiment, to reduce power consumption and/or improve performance and ensuring that the timing information tracks the data. However, the synchronized data capture circuit preferably receives and outputs full swing signals to allow the circuit to be compatible with other circuits in the IC that also employ fall swing signals. In this manner, compatibility is preserved while saving power and/or improve performance.

Figure 2A:
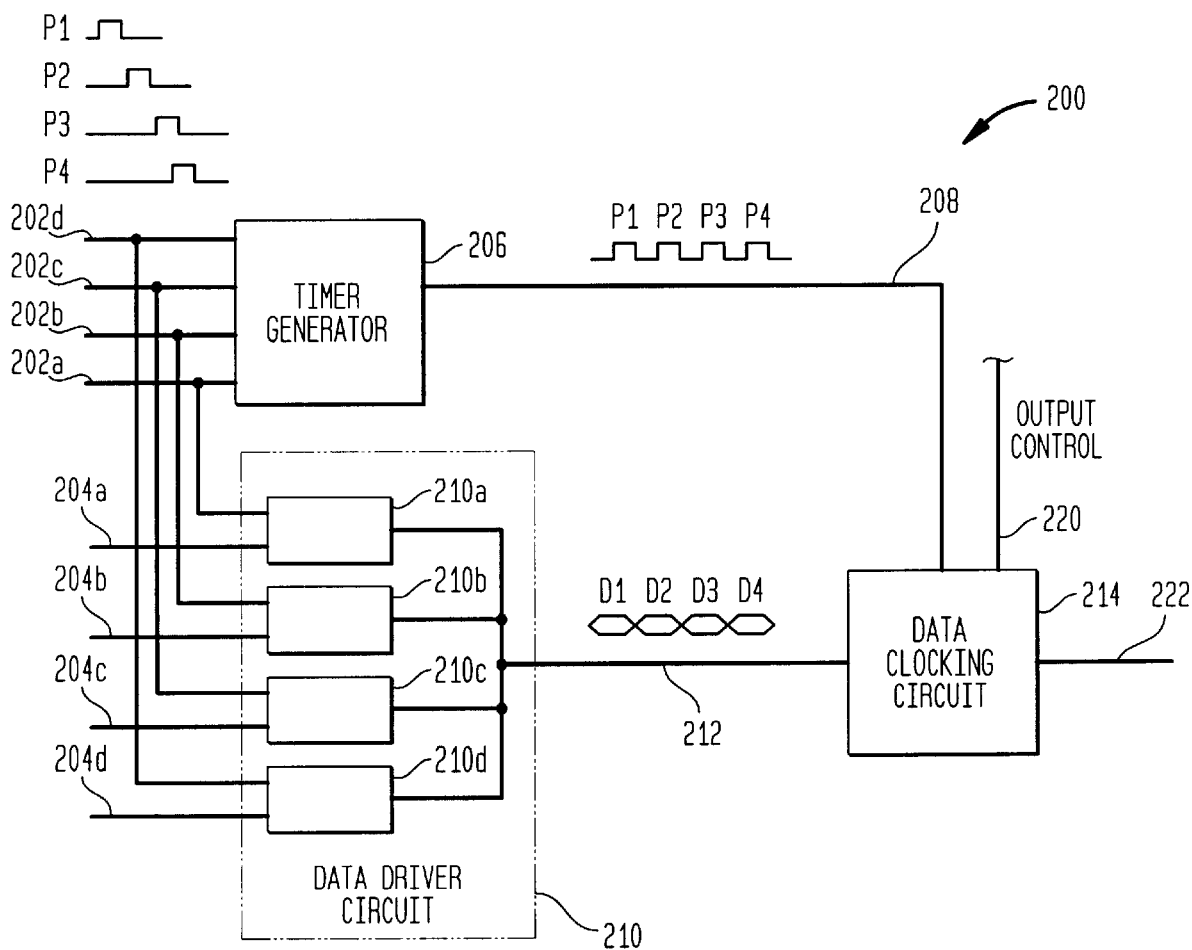
FIG. 2A illustrates, in accordance with one embodiment of the present invention, a synchronized data capture circuit having a prefetch architecture for use in integrated circuits such as dynamic random access memory (DRAM) integrated circuits.

The features and advantages of the present invention may be better understood with reference to the figures and discussions that follow. FIG. 2A illustrates, in accordance with one embodiment of the present invention, a synchronized data capture circuit 200 having a prefetch architecture for use in integrated circuits such as dynamic random access memory (DRAM) integrated circuits. Referring to FIG. 2A, there are shown a plurality of timing signals 202a, 202b, 202c, and 202d, representing the timing signals received for the purpose of synchronizing data launching with a plurality of data signals 204a, 204b, 204c, and 204d. Although only four timing signals and four data signals are shown to simplify the discussion, it should be noted that the invention is not limiting with respect to the number of timing signals and/or data signals involved.

The timing signals containing relatively low frequency timing pulses are input into a timer generator 206, which aggregates the timing pulses from timing signals 202a–202d to output a higher frequency stream of timing pulses on a conductor 208. Each of the timing signals 202a–202d is also input into a respective one of data driver circuits 210a–210d. That is, timing signal 202a is input into data driver circuit 210a, timing signal 202b is input into data driver circuit 210b, and so on. Further, each of data signals 204a–204d is also input into a respective one of data driver circuits 210a–210d. That is, data signal 204a is input into data driver circuit 210a, data signal 204b is input into data driver circuit 210b, and so on.

The set of data driver circuits 210a–210d represents the circuitry for prefetching the data from data signals 204a–204d to output a high frequency data stream on a conductor 212 as shown. In one embodiment, each data driver circuit in the set is configured to clock the data pulse on its respective data signal, using its respective timing signal. The outputs of the data driver circuits in the set are then coupled together to permit the data clocked from the multiple data driver circuits in the set to be output in a serial manner as a high frequency data stream.

A data clocking circuit 214 receives the high frequency data stream on conductor 212 and captures the data therein in a synchronized manner using the high frequency timing pulse stream on conductor 208.

The operation of synchronized data capture circuit 200 may be better understood with reference to the example discussed below. Timing pulses p1, p2, p3, p4 arrive staggered in time on respective timing signals 202a, 202b, 202c, 202d as shown by the timing diagram above the timing signals. Serializing these timing pulses results in a higher frequency timing pulse stream p1-p2-p3-p4 as shown, which is then input into data clocking circuit 214 as a serial stream with p4 being the first timing pulse and p1 being the last timing pulse to arrive at data clocking circuit 214. Data pulses d1, d2, d3, and d4 are prefetched and serialized into a high frequency data stream d1-d2-d3-d4 as shown, which is then input into data clocking circuit 214 as a serial stream with d4 being the first data pulse and d1 being the last data pulse to arrive at data clocking circuit 214. Clocking circuit 214 employs timing pulse p4 to synchronize the capture of data pulse d4, timing pulse p3 to synchronize the capture of data pulse d3, timing pulse p2 to synchronize the capture of data pulse d2, and timing pulse p1 to synchronize the capture of data pulse d1. The data capture is then output, responsive to a control signal 220, as a high frequency stream of synchronized capture data e.g. to an external circuit through a conductor 222.

Note that due to prefetching, it is possible to perform synchronized data capture at a higher frequency than the frequency of the individual data signals (e.g., 204a–204d) and/or the frequency of the individual timing signals (e.g., 202a–202d). Accordingly, the data signals and/or the timing signals may have a frequency that is significantly lower than the frequency of the output data required by the external logic circuitry. In the example of FIG. 2A, the frequency of operation of the data signals and/or the timing signals input into the synchronized data capture circuit is roughly ¼ the frequency of the data output from the synchronized data capture circuit. This is highly advantageous in ICs such as dynamic random access memory circuits since, as mentioned earlier, the speed of the memory cells and the long, heavily loaded data lines present difficulties when one attempts to operate the data lines at a high frequency. By removing the bottleneck between the slower memory cells and the higher speed logic circuits that request the stored data, device performance may be advantageously improved.

Figure 2B:
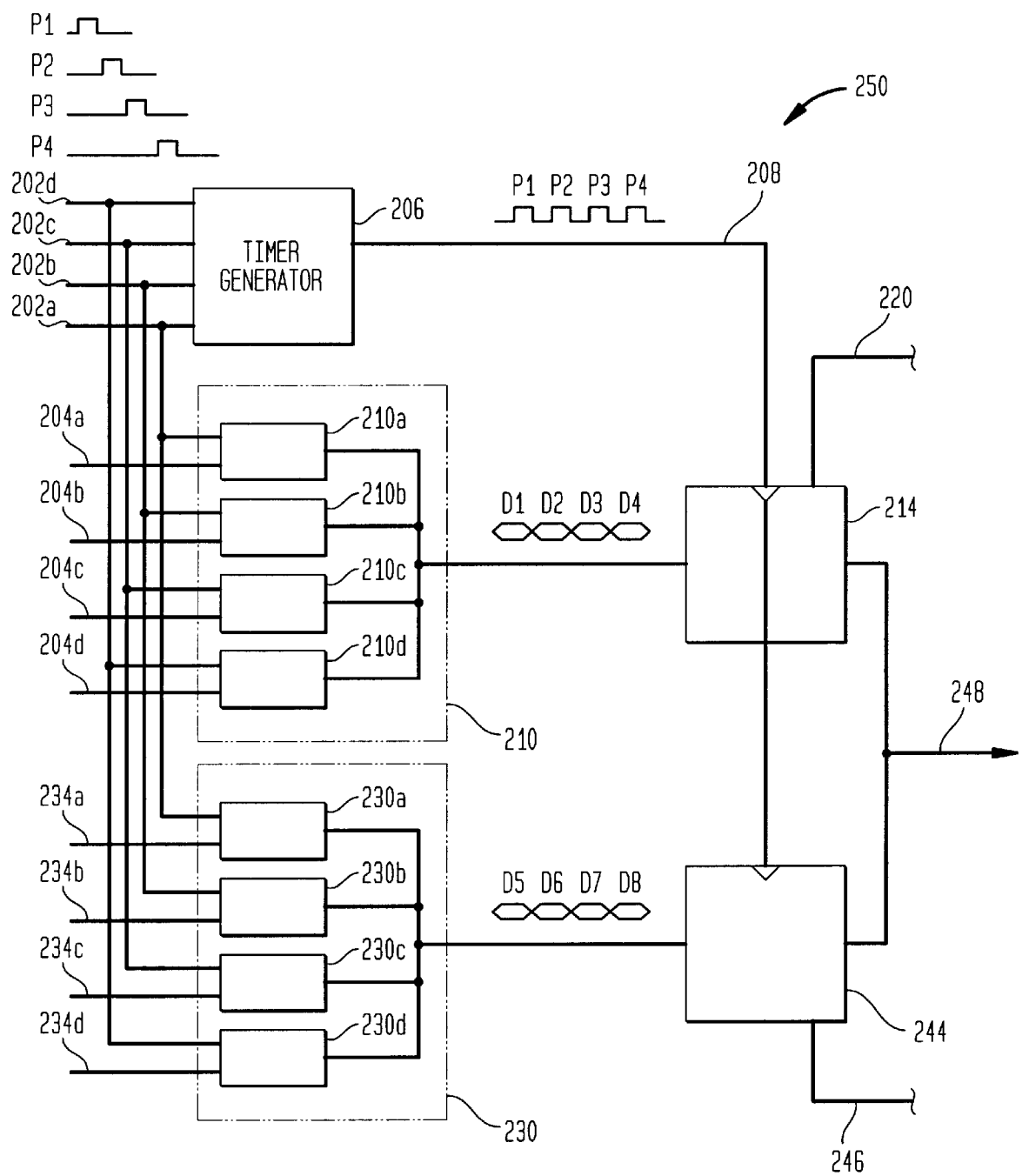
FIG. 2B illustrates, in accordance with an alternate embodiment of the present invention, a synchronized data capture circuit having a distributed data prefetch architecture to allow the data signals to operate at a lower frequency.

FIG. 2B illustrates, in accordance with the invention an alternate embodiment of the present invention, a synchronized data capture circuit 250 having a distributed data prefetch architecture to allow the data signals (e.g., data signals 204a–204d) to operate at an even lower frequency. With reference to FIG. 2B, suppose there are 8 data lines forming two groups: data lines 204a–204d and data lines 234a–234d. Note that although the number of sets is chosen to be two to simplify the discussion, the number of sets may vary as desired. In a memory circuit, the set of data lines 204a–204d may represent, for example, the odd data set and the set of data lines 234a–234d may represent, for example, the even data set. Each set of data lines 204a–204d and 234a–234d is input into a respective data driver 210 and 230. That is, data drivers 210a–210d prefetch and serialize data pulses from data signals 204a–204d while data drivers 230a–230d prefetches and serializes data pulses from data signals 234a–234d. Out of data driver circuits 210 and 230, two high frequency data streams are formed, each of which has a frequency that is roughly four times the frequency of the individual data lines input into the data driver circuits.

Each high frequency data stream is input into a respective data clocking circuit 214 and 244. Data synchronization is performed at both of these data clocking circuits 214 and 244 using the high frequency timing pulse stream generated from timer generator 206. That is, synchronized data capture is performed at each of the data clocking circuits 214 and 244 using the timing information from the same high frequency stream of timing pulses. Note that the high frequency timing pulse stream has the same frequency as that of each high frequency data streams. As will be discussed later herein, each data clocking circuit preferably includes tri-state circuitry as well as latch circuitry to allow output controls 220 and 246 to output the captured data in an interleaved manner, with a bit from each high frequency data stream being output in turn through a conductor 248. Note that in order to have the possibility to delay the output data on 248, it may be desirable to have within each of the circuits 214 and 244 a set of latches into which the data can be loaded.

As can be appreciated from the foregoing example, the data output from synchronized data capture circuit 250 has a frequency that is roughly 8 times the frequency of the individual data signals input into the synchronized data capture circuit. This allows data to be synchronized and output at an even higher frequency for a given speed of the data signals and/or timing signals.

Figure 2C:
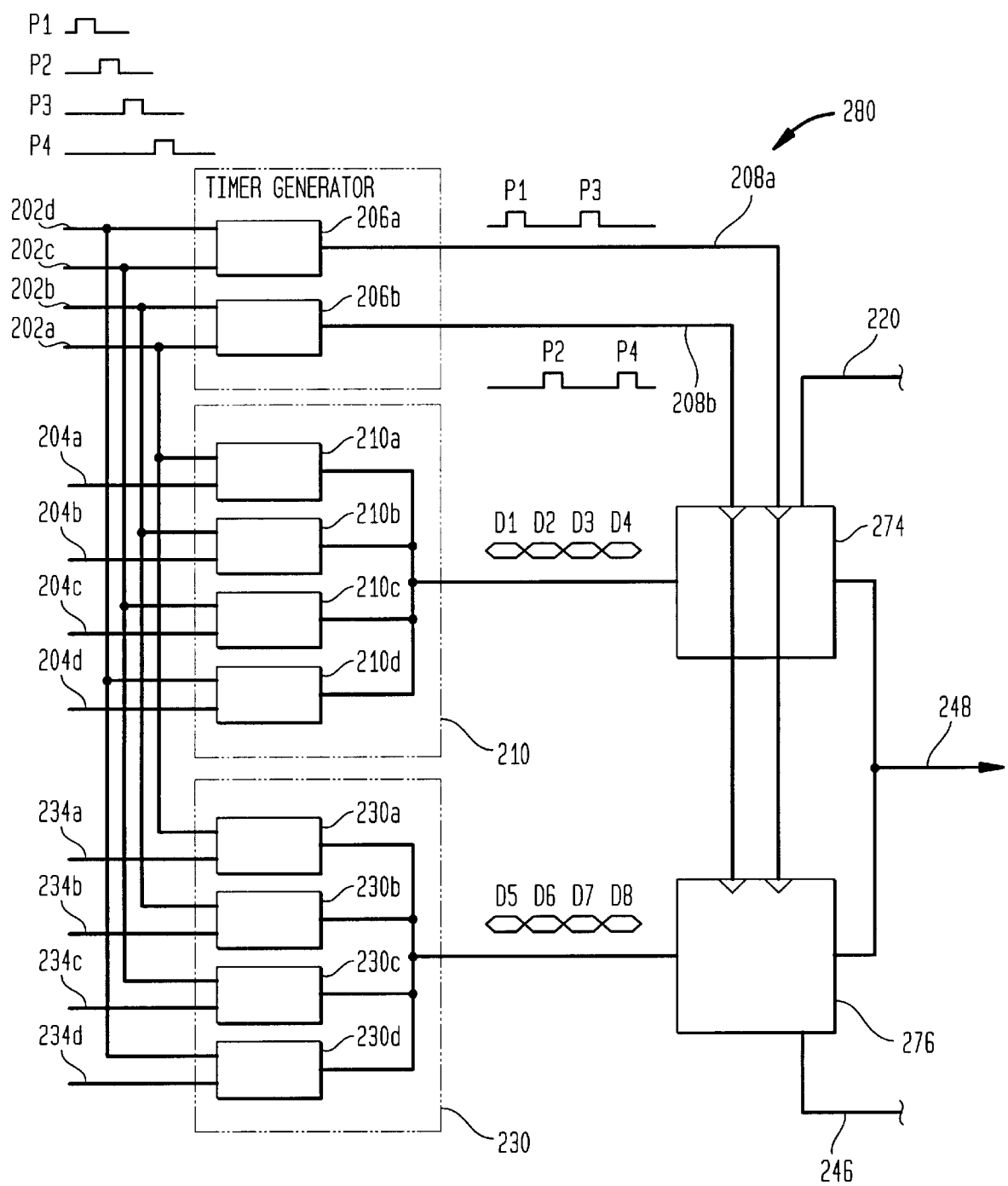
FIG. 2C illustrates, in accordance with an alternate embodiment of the present invention, a synchronized data capture circuit having a distributed prefetch architecture to allow the data signals and the timing signals to operate at a lower frequency.

FIG. 2C illustrates, in accordance with the invention an alternate embodiment of the present invention, a synchronized data capture circuit 280 having a distributed data prefetch architecture to allow the data signals (e.g., data signals 204a–204d and 234a–234d) to operate at a low frequency. In addition the frequency of the timing signals (208a and 208b) which control the data capturing is reduced further in comparison with FIG. 2b. With reference to FIG. 2C, the timer generator 206 of FIG. 2B has been substituted by timer generators 206a and 206b, each of which receives only two timing signals: 202a/202c for timer generator 206a and 202b/202d for timer generator 206b. Note that the set of timing signals are chosen so that the timing pulses of the output signal are interleaved in time. Further, note that although the number of sets is chosen to be two to simplify the discussion, the number of sets may vary as desired. Each of timer generators 206a and 206b aggregates the timing pulses from only two timing signals and consequently outputs a high frequency timing pulse stream that is only at twice the frequency of the timing signals that are input into synchronized data capture circuit 280. In the example of FIG. 2C, each high frequency timing pulse stream (208a, 208b) is also at ½ the frequency of the high frequency data stream output by each of data driver circuits 210 and 230.

The two high frequency timing pulse streams out of timer generators 206a and 206b are provided in parallel to two data clocking circuits 274 and 276. These data clocking circuits then aggregate the timing pulses of the two parallel high frequency timing pulse streams (using an OR gate, for example) to form an even higher frequency timing pulse stream that matches the frequency of the high frequency data streams output by each of data driver circuits 210 and 230.

Data synchronization is performed at both of these data clocking circuits 274 and 276 using timing information provided in both high frequency timing pulse streams generated from timer generators 206a and 206b. As in the case of FIG. 2C, each data clocking circuit preferably includes tri-state circuitry as well as latch circuitry to allow output controls 220 and 246 to output the captured data in an interleaved manner, for example with a bit from each high frequency data stream being output in turn through conductor 248 to boost the frequency on the data output (248) even further.

It should be noted that it is possible to provide the timing information for data capture on different lines and then at the location of data capture circuit combining locally the different timing streams without the distributed data prefetch. With reference to FIG. 2C, for example, it is possible to omit data driver circuits 230a–d and data clocking circuit 276 to form a synchronized data capture circuit without a data pre fetch feature (such as that shown in FIG. 2A).

In accordance with one aspect of the present invention, the prefetch feature of the synchronized data capture circuit may be combined with the use of reduced voltage signals to reduce power consumption and/or improve performance. That is, each of the timer generator circuit, the data driver circuit, and the data clocking circuit may be configured to work with reduced voltage signals. In the case of the timer generator circuit and the data driver circuit (e.g., timer generator circuit 206 and data driver circuit 210 of FIG. 2a), it is desirable to make their input signals compatible with full swing voltage signals to render these circuits backward compatible with other circuits of the IC. The outputs (e.g., the high frequency data stream and high frequency timing pulse stream) may be formed using reduced voltage signals to achieve the aforementioned advantages in power consumption and performance. In the case of the data clocking circuit (e.g., data clocking circuit 214 of FIG. 2A), it is desirable to accept reduced voltage signals as inputs while keeping the outputs compatible with full swing voltage signals to allow the circuit to interface with other circuits of the ICs that employ full swing voltage signals.

Exemplary implementations of both the full swing and the reduced swing versions of these circuits (i.e., the timer generator circuit, the data driver circuit, and the data clocking circuit) will be examined in turn hereinbelow.

Figure 3:
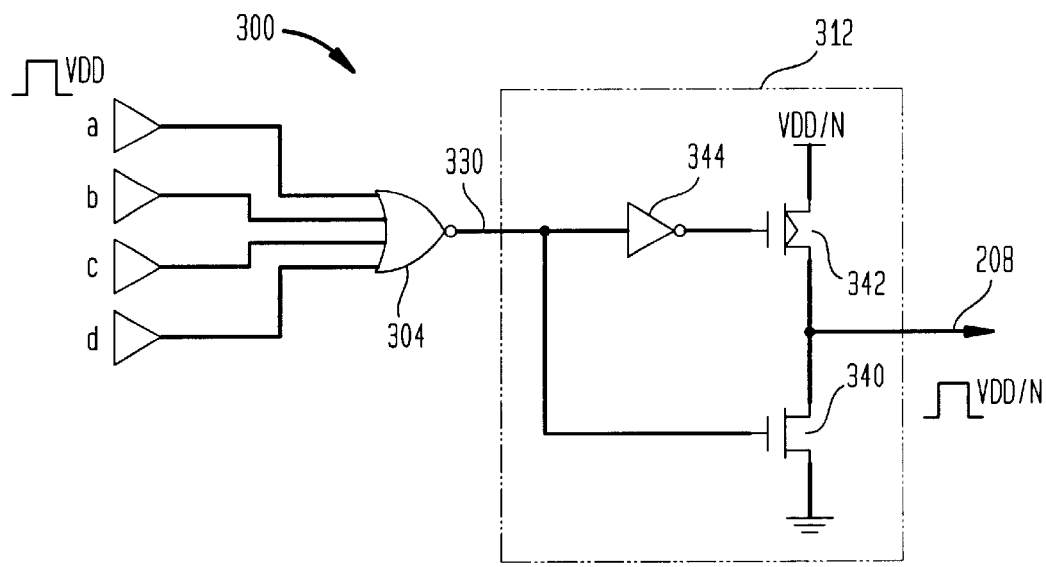
FIG. 3 illustrates, in accordance with one embodiment of the present invention, a timer generator circuit that can output a high frequency timing pulse stream at reduced voltage levels from parallel timing signals operating at full swing voltages and lower frequency.

FIG. 3 illustrates, in accordance with one embodiment of the present invention, a timer generator circuit 300, representing a detailed implementation of timer generator circuit 206 of FIG. 2A that can output a high frequency timing pulse stream at reduced voltage levels from parallel timing signals operating at full swing voltages and lower frequency. Note that although the circuit of FIG. 3 is a preferred implementation, it is only exemplary and the invention is not so limiting. As can be seen in FIG. 3, each input of the NOR 304 is coupled to a full swing timing signals a, b, c and d. It may be desirable to have in front of the inputs of the NOR a circuit to tailor the pulse shape of the timing signals (pulse shaper circuit). This may be advantageous, since by tailoring the input pulse shapes one is tailoring the pulse shape of the output of the timer generator circuit.

The generated timing pulses having full swing voltage levels appear at node 330 in FIG. 3. Reduced voltage output stage 312 translates the full swing timing pulses to reduced voltage levels for output through conductor 208.

In general, only one of full swing timing signals a, b, c, and d can be high at any given time. Every time one of the full voltage timing signals goes high, a reduced voltage timing pulse is generated on output conductor 208 of FIG. 3, with the width of the reduced voltage timing pulse determined by the pulse shaper circuit which receives the full swing timing signal being. Instead of having a pulse shaper circuit at the different inputs of the NOR 304, it may be advantageous to have just one pulse shaper at the output of the NOR in front of the low voltage output stage 312.

To facilitate further understanding, the operation of circuit 300 will now be discussed in detail. When all of full swing timing signals a–d are low, node 330 will be high at VDD. The high voltage level at node 330 causes the output of an inverter 344 to go low, thereby turning off an n-FET 342. However, the high voltage level at node 330 will also turn on an n-FET 340, thereby pulling output conductor 208 to ground. The circuit is now in its ready state to respond to the assertion of the next full swing timing signal a, b, c, or d.

As mentioned earlier, only one of full swing timing signals a–d can be high at any given time. With this restriction in mind, consider the situation when full swing timing signal a is high and all other full swing timing signals b, c, and d are low (condition 2). In this condition, the output of 4-input NOR gate 304 is low. The low node 330 turns off n-FET 340 to decouple output conductor 208 from ground. The same low node 330 also turns on n-FET 342 to pull output conductor 208 to the reduced voltage level VDD/N. Thus the assertion of the full swing timing signal a causes a timing pulse having a reduced voltage level to appear at output conductor 208. The duration of the pulse may determined by the pulse shaper circuit as discussed above.

Some time after the assertion of the full swing timing pulse a, a will go low a going low will cause node 330 to go high turning off the pull up n-FET 342. 330 going high will turn on the n-FET 340, causing the output 208 to be pulled down from the reduced voltage level to ground. A subsequent assertion of any of the full swing timing signals a–d causes another timing pulse having a reduced voltage level to be generated at output conductor 208 in the manner discussed earlier.

Figure 4:
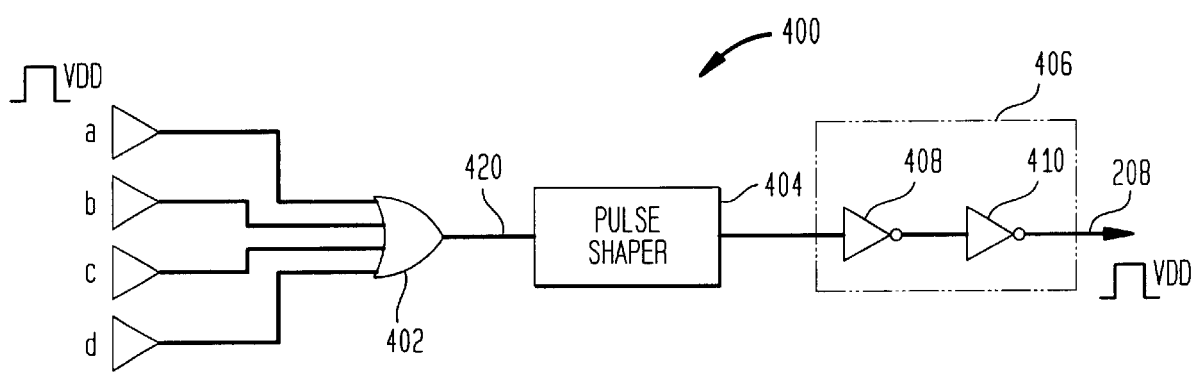
FIG. 4 illustrates, in accordance with one embodiment of the present invention, a timer generator circuit that can output a high frequency timing pulse stream at full swing voltage levels from parallel timing signals operating at full swing voltages and lower frequency.

FIG. 4 illustrates, in accordance with one embodiment of the present invention, a timer generator circuit 400, representing a detailed implementation of timer generator circuit 206 of FIG. 2A that can output a high frequency timing pulse stream at full swing voltage levels from parallel timing signals operating at full swing voltages and lower frequency.

Note that although the circuit of FIG. 4 is a preferred implementation, it is only exemplary and the invention is not so limiting. Timer generator circuit 400 includes an OR gate 402, a pulse shaper 404, and a delay/driver circuit 406, which is implemented by a pair of standard CMOS inverters 408 and 410 in FIG. 4.

A number of full swing timing signals such as a–d can be provided as inputs to OR gate 402 so that when one of these signals pulses, a high voltage pulse would be outputted at node 420. Since OR gate 402 is conventional, the high voltage level output by OR gate 402 is a conventional VDD level. As discussed earlier, pulse shaper 404 can optionally be utilized to control the pulse width of the output timing pulses. After optional pulse shaping, the output pulse is delayed and/or driven by delay/driver circuit 406 to be output on output conductor 208.

Figure 5A:
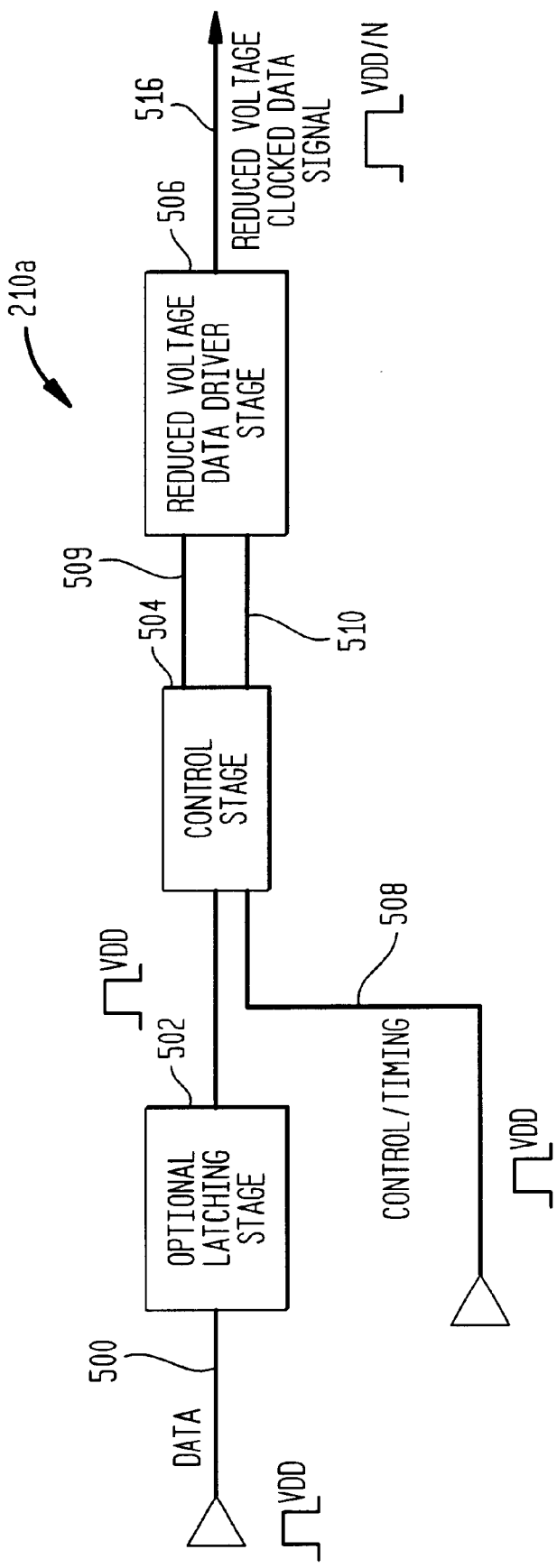
FIG. 5A illustrates, in accordance with one embodiment of the present invention, a high level block diagram implementation of the data driver circuit of FIG. 2.

FIG. 5A illustrates, in accordance with one embodiment of the present invention, a high level block diagram implementation of data driver circuit 210a of FIG. 2 that can output, responsive to full swing timing signals, reduced voltage level data pulses from an input data signal operating at full swing voltage levels. As mentioned earlier in connection with FIG. 2, data driver circuits 210a–210d, which can be similar in construction, can have their outputs coupled together to facilitate outputting a high frequency data stream from the low frequency data signals input in parallel. If each data driver circuit is implemented in the manner discussed in connection with FIG. 5, the high frequency data stream output has reduced voltage level.

As shown, data driver circuit 210a receives as its input the full swing data signal at input node 500. The full swing data signal is input into an optional latching stage 502, which may be employed to hold the data until required by a control stage 504. Control stage 504 receives as its inputs latched data from latching stage 502 and the full swing timing signal at an input node 508.

Control stage 504 is employed to tri-state, responsive to a first state of the timing signal at input node 508, a reduced voltage data driver stage 506.

From the latched data signal and the timing signal the signals 509 and 510 are derived and provided to the reduced voltage data driver stage 506, which outputs the reduced voltage clocked data signal on conductor 516 (to be coupled with other data driver circuits to produce the high frequency data stream). In this manner, data driver circuit 210 receives the full swing data and timing signals and outputs a reduced voltage data signal having a reduced voltage level. Note that the data signal 500 can also have a reduced voltage swing.

Figure 5B:
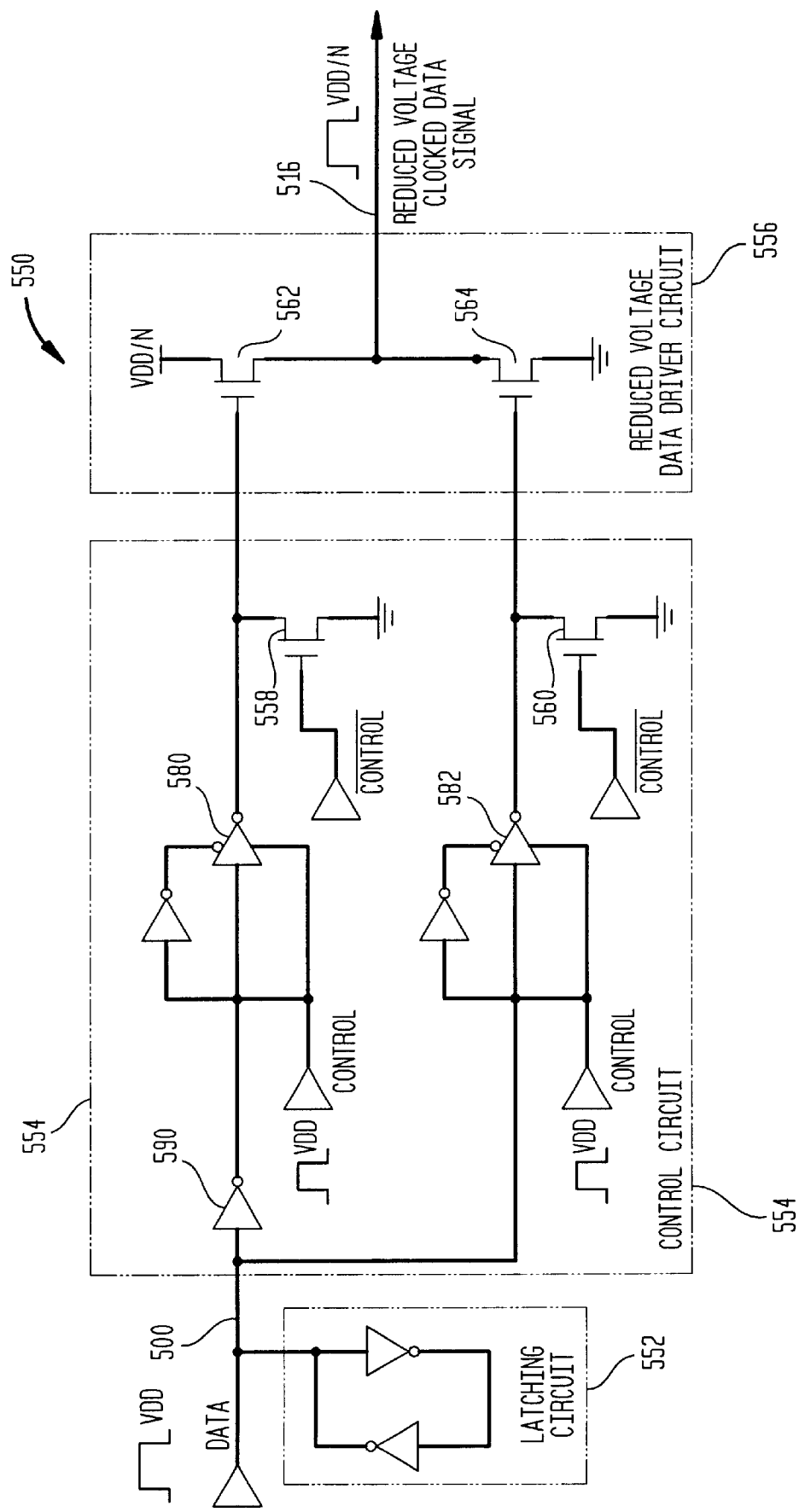
FIG. 5B illustrates, in accordance with one embodiment of the present invention, a detailed implementation of data driver circuit of FIG. 5A that is capable of outputting a reduced voltage data signal from full swing data and timing signals.

FIG. 5B illustrates, in accordance with one embodiment of the present invention, data driver circuit 550, representing a detailed implementation of data driver circuit 210a of FIG. 5A. Although the circuit of FIG. 5B is a preferred implementation, it is only exemplary and the invention is not so limiting. Again, input node 500 of FIG. 5A, which carries the full swing data signal is shown in FIG. 5B. Latching circuit 552 is a commonly used implementation of latching stage 502 of FIG. 5A although any conventional latching technique may well be employed. Reduced voltage data driver circuit 556 is one implementation of reduced voltage data driver stage 506 of FIG. 5A and is employed to shift the voltage level of the clocked data signal from a full swing voltage level to a reduced voltage level.

Control circuit 554 is one implementation of control stage 504 of FIG. 5A. In the example of FIG. 5B, when the timing signal is low, control circuit 554 tri-states the output reduced voltage clocked data signal line (at conductor 516) from the remainder of data driver circuit 550. By way of example, a low control signal disables inverting tri-state buffers 580 and 582, essentially decoupling the full swing data signal line (at input node 500) from reduced voltage data driver circuit 556. A low control signal also turns on n-FETs 558 and 560 to pull the gates of n-FETs 562 and 564 of reduced voltage data driver circuit 556 to ground. Accordingly, n-FETs 562 and 564 are both off, essentially tri-stating output conductor 516 from the remainder of data driver circuit 550.

When the control signal goes high, the gates of n-FETs 558 and 560 go low, which turn these n-FETs 558 and 560 off, thereby decoupling the gates of n-FETs 562 and 564 from ground. The high state of the control signal also enables inverting tri-state buffers 580 and 582. If the data latched by latching circuit 552 is high, the output of inverting tri-state buffer 582 will be low, thereby turning off n-FET 564, thus decoupling output conductor 516 from ground. On the other hand, inverter 590 will cause the data to appear low at the input of inverting tri-state buffer 580, causing inverting tri-state buffer 580 to pull the gate of n-FET 562 high, thus turning on n-FET 562 and coupling output conductor 516 to the reduced voltage source VDD/N. In an analogous manner, if the control signal is high and the latched data is low, n-FET 562 will be off and n-FET 564 will be on, causing output conductor 516 to be pulled to ground. As can be seen, data driver circuit 550 of FIG. 5B clocks out a reduced voltage data signal responsive to the input full swing control signal.

Figure 6:
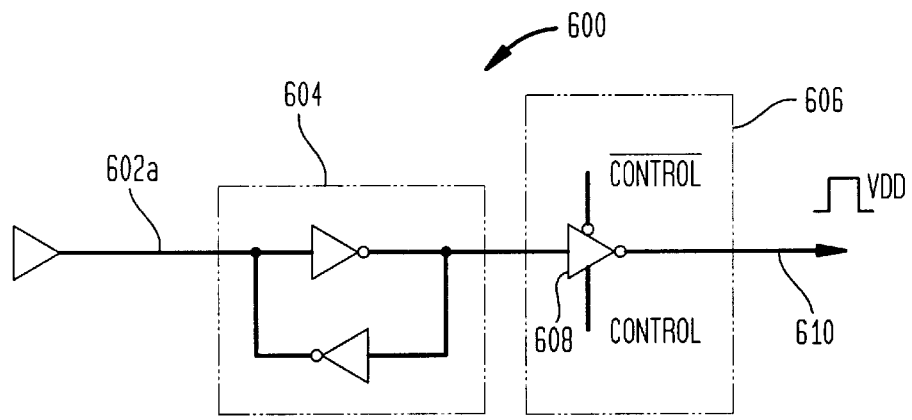
FIG. 6 illustrates, in accordance with one embodiment of the present invention, a detailed implementation of data driver circuit of FIG. 5A that is capable of outputting a full swing data signal from full swing data and timing control signals.

FIG. 6 illustrates, in accordance with one embodiment of the present invention, a data driver circuit 600, representing an implementation of data driver circuit 210a of FIG. 2 that can output, responsive to full swing timing signals, full voltage swing data pulses from an input data signal operating at full swing voltage levels. Although the circuit of FIG. 6 is a preferred implementation, it is only exemplary and the invention is not so limiting. Full swing data signal is received at a node 602a to be latched by a latch circuit 604 where the data is kept until clocked out by an output control/driver 606. In the example of FIG. 6, output control/driver 606 is implemented by an inverting tri-state buffer 608 although other types of control/driver circuits may well be employed. When the control signal is asserted, the latched data at the input of inverting tri-state buffer 608 is inverted again by inverting tri-state buffer 608 prior to being passed to an output 610. Thus the data originally input at node 602a is passed to output 610. For clarification, it should be pointed out that the latched data at the input of inverting tri-state buffer 608 is an inverted form of the data at node 602a due to the inverter of the latch.

Figure 7:
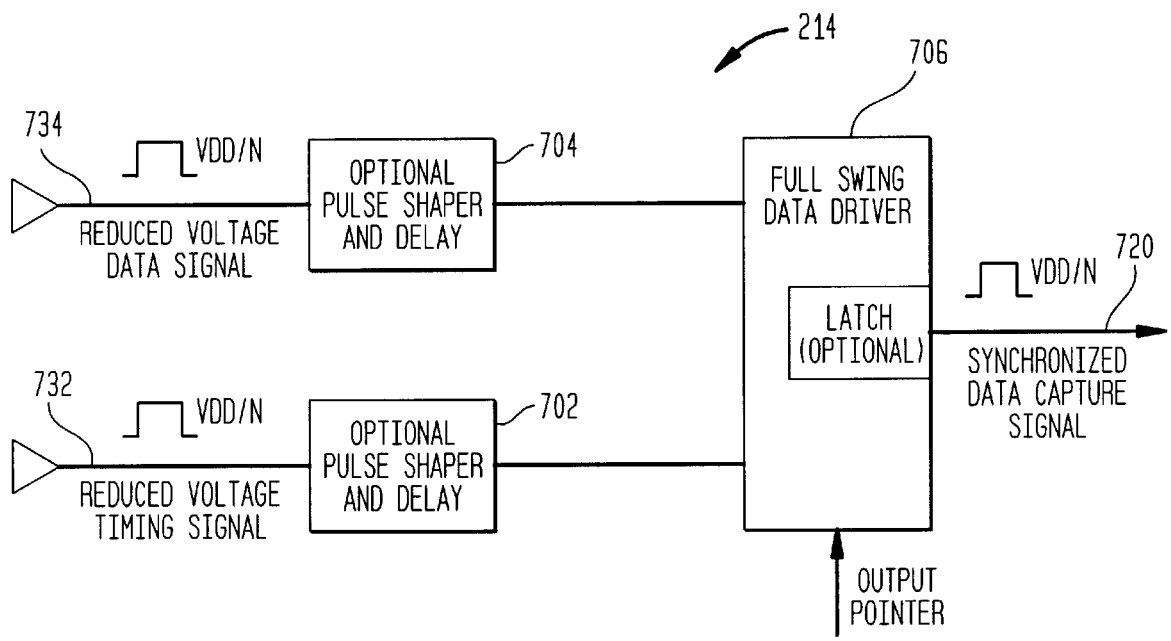
FIG. 7 illustrates, in accordance with one embodiment of the present invention, a high level block diagram implementation of the data clocking circuit of FIG. 2.

FIG. 7 illustrates, in accordance with one embodiment of the present invention, a high level block diagram implementation of a data clocking circuit, such as data clocking circuit 214 of FIG. 2, that is capable of capturing in a synchronized manner the reduced voltage high frequency data stream by using the reduced voltage high frequency timing pulse stream. The synchronized data capture signal represents a signal outputting the synchronized captured data with full swing of the received reduced voltage data signals (input as parallel data signals into the synchronized data capture circuit) with the timing information provided in the reduced swing timing signals (input as parallel timing signals into the synchronized data capture circuit).

As shown, both the reduced voltage timing signal on conductor 732 and the reduced voltage data signal on conductor 734 may be delayed and/or have their pulses properly shaped via optional pulse shaper/delay circuits 702 and 704 respectively. Thereafter, these signals are furnished to a full swing data driver 706, which performs the data synchronization on these two reduced voltage level signals and produces a full swing synchronized data capture signal on output node 720. The output of circuit 706 is controlled by output pointers, which cause the captured data to appear on the output node 720 of the circuit 706.

In one embodiment, the output of the synchronized data capture circuit is tri-stateable. As such, the outputs of individual synchronized data capture circuits (such as that shown in FIGS. 2B and 2C) may then be clocked out at the receiving end using an appropriate output pointer. Such an implementation is advantageous if a prefetch is implemented at that stage.

Figure 8:
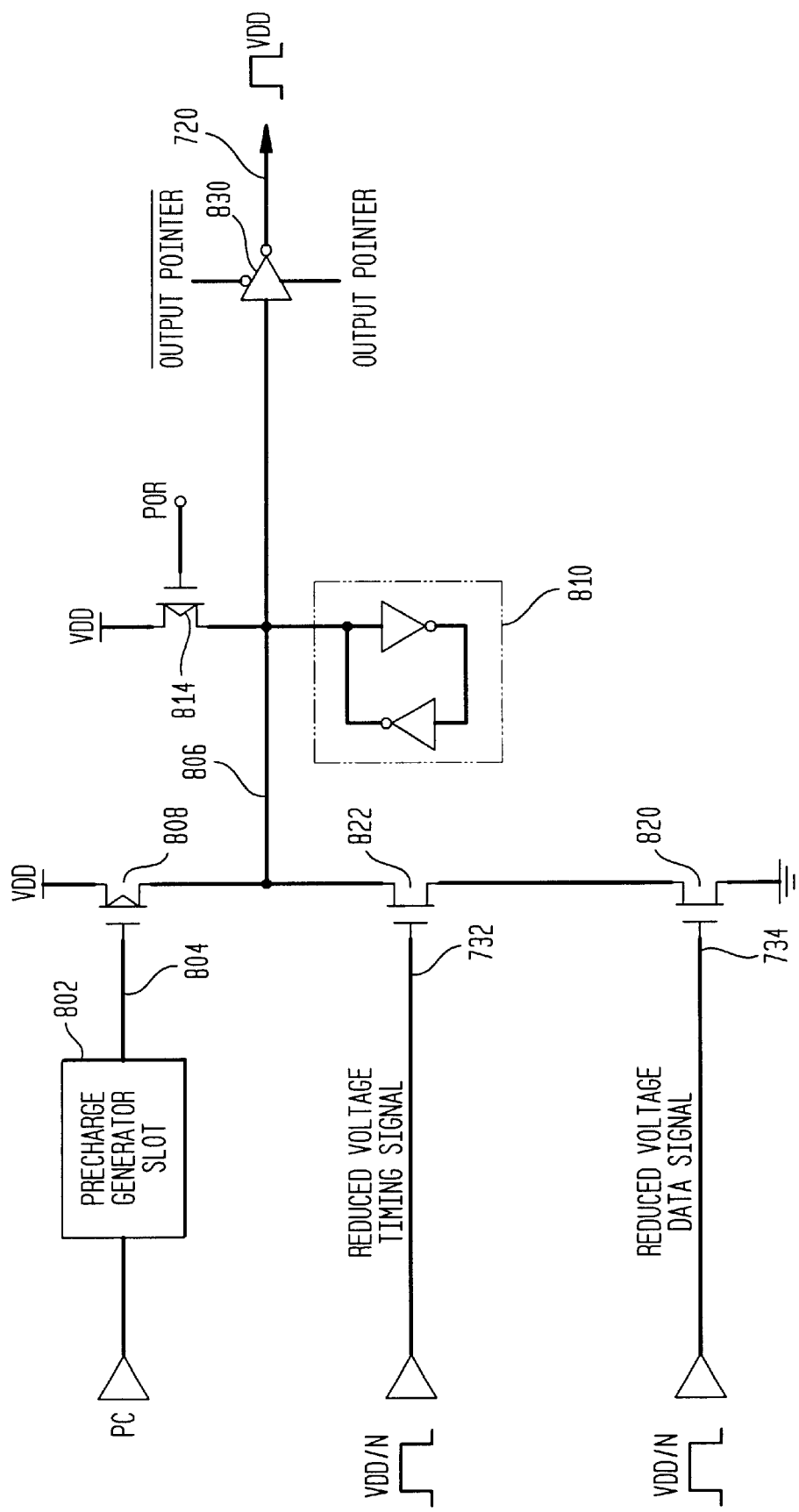
FIGS. 8 and 9 illustrate, in accordance with one embodiment of the present invention, a detailed implementation of data clocking circuit of FIG. 7 and the timing diagram therefor.

FIG. 8 illustrates, in accordance with one embodiment of the present invention, a data clocking circuit 800, representing a detailed implementation of data clocking circuit 214 of FIG. 7. The circuit of FIG. 8 is most easily understood with reference to the timing diagram of FIG. 9. Note that although the circuit of FIG. 8 is a preferred implementation, it is only exemplary and the invention is not so limiting. Furthermore, optional pulse shaping/delay circuits (discussed in connection with FIG. 7) have been omitted to simplify the discussion.

In FIG. 8, there is shown a precharge generator circuit 802, which is employed to generate a low precharge pulse derived from the output pointer on a node 804. The low precharge pulse is employed to place a node 806 in a known state prior to data capturing.

Preferably, the precharge pulse goes low after outputting the captured data. As the precharge pulse goes low at node 804, a p-FET 808 conducts, thereby pulling node 806 to VDD. Node 806 is latched high (VDD) by a latching circuit 810, which is shown in FIG. 8. Note that node 806 can also be pulled high optionally by a p-FET 814 upon power up or a power reset, conditions which generate a low pulse on the POR signal. This is intended to place node 806 in a known state upon power up or a power reset.

Since the precharge pulse on node 804 is arranged to go low prior to the arrival of the reduced voltage data and after outputting the captured, n-FETs 820 and 822 stay off.

From time t1 to t3, the data contained in the reduced voltage clocked data signal is valid and can be synchronized with the reduced voltage timing signal. If the piece of data to be captured has a high value VDD/N, the high value of the reduced voltage clocked data signal turns on an n-FET 820. However, since the reduced voltage timing signal has not arrived at time t1, an n-FET 822 remains off. At time t2 (see FIG. 9), the reduced voltage timing signal is asserted, causing n-FET 822 to also turn on. A current path is thus created between node 806 and ground starting at about time t2, causing node 806 to be pulled to ground. The latch circuit 810 latches the complement of the data signal. At time t6 the timing signal goes low, interrupting the current path.

At the time t7 an output pointer signal pulse is provided causing the tri-state buffer 830 to switch from the tri-state state into the conducting state. Due to that, the tri-state buffer now inverts the latched complement of the data signal, resulting in the appearance of the captured data at the output node 720 with full swing.

On the other hand, if the piece of data to be captured has a low value, n-FET 820 remains off even after the arrival of the reduced voltage timing pulse (starting at time t2). Node 806 thus remains high, corresponding to the capture and latching of the complement of the data signal. Accordingly, a full swing captured data signal is created at output node 720 when the output pointer is provided.

Figure 9:
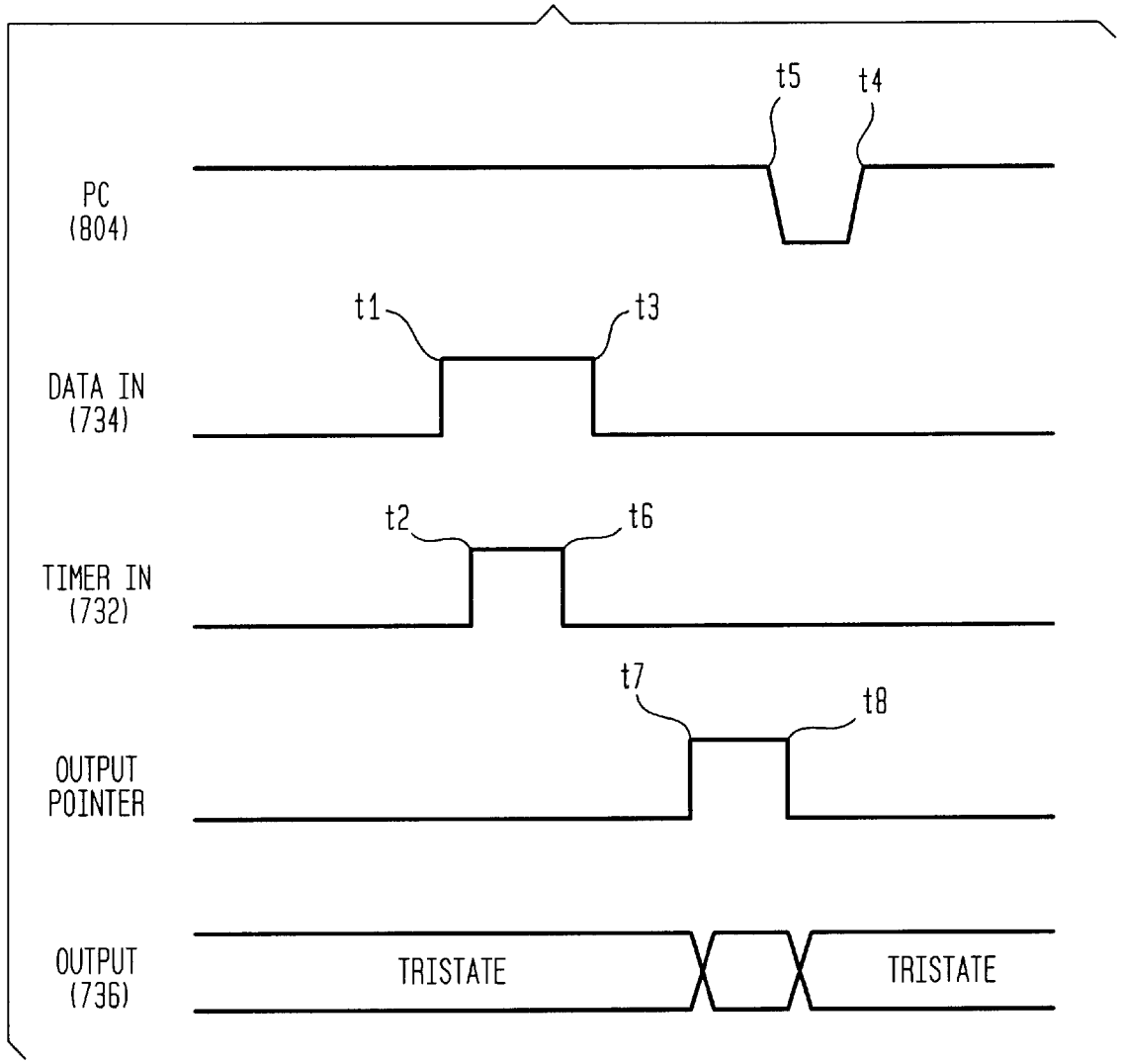

After the captured data is outputted, a low precharge pulse generated from the output pointer restores data clocking circuit 800 back to its ready state for the next data synchronization cycle. With reference to FIG. 9, the precharge signal goes low at time t5, pulling node 806 high and latching it at the high value to prepare for the arrival of the next data and timing cycle.

Figure 10A:
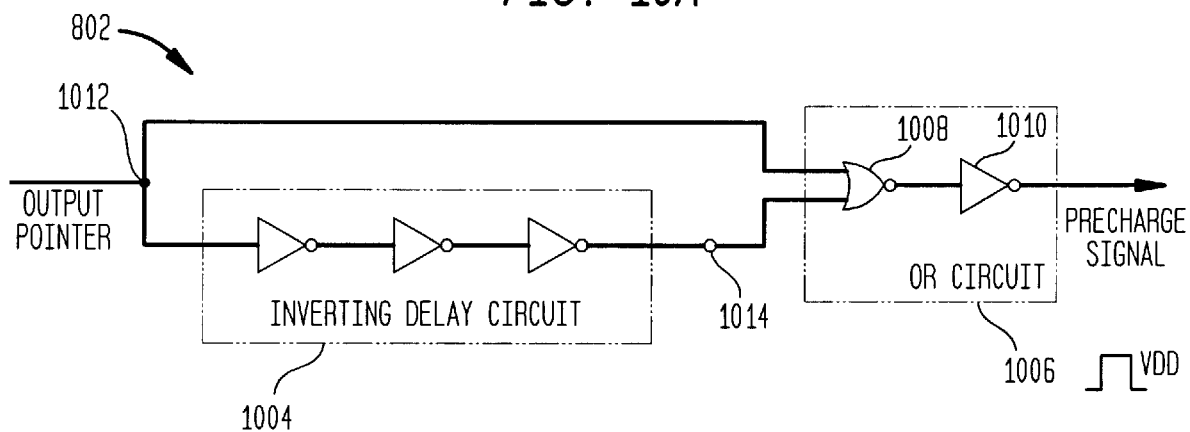
FIGS. 10A and 10B illustrate, in accordance with one embodiment of the present invention, a detailed implementation of precharge generation circuit of FIG. 8 and the timing diagram therefor.
Figure 10B:
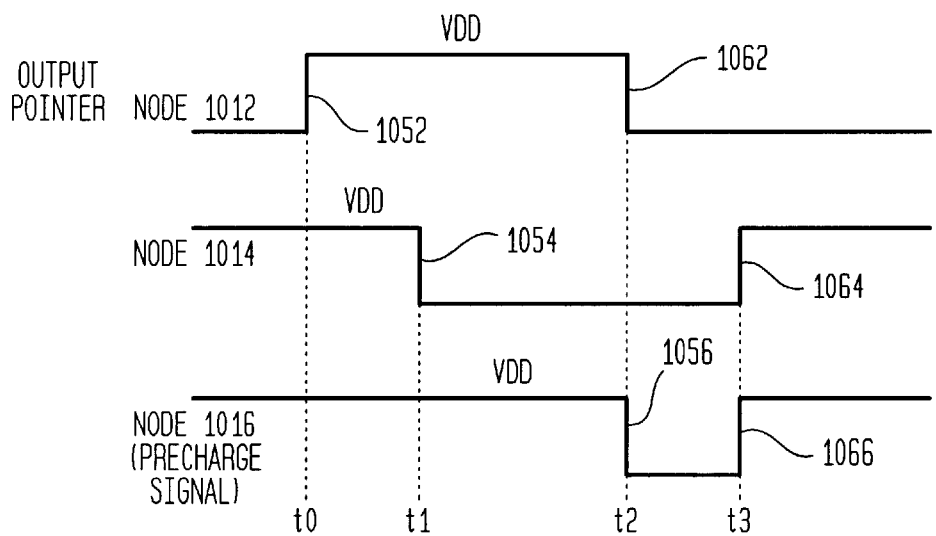

FIG. 10A illustrates, in accordance with one embodiment of the present invention, a detailed implementation of precharge generation circuit 802 of FIG. 8. The circuit of FIG. 10A is most easily understood with reference to the timing diagram of FIG. 10B. Note that although the circuit of FIG. 10A is a preferred implementation, it is only exemplary and the invention is not so limiting.

With reference to FIG. 10A, the full swing output pointer signal on conductor 1012 is then delayed through an inverting delay circuit 1004, which is implemented in the example of FIG. 10A by three CMOS inverters (the specific number of inverters in the delay chain is only exemplary and may vary as needed). The output of inverting delay circuit 1004 is OR'ed via an OR circuit 1006 with the full swing output pointer signal. In the example of FIG. 10A, the OR operation is performed by a NOR gate 1008 in series with an inverter gate 1010 although this is only exemplary. As will be apparent in the discussion that follows, the combination of inverting delay circuit 1004 and OR circuit 1006 creates a pulse shaper circuit, with the width of the precharge pulse determined by the delay time of delay circuit 1004.

In operation, when the output pointer signal on conductor 1012 is low initially, node 1014, which is the inverted and delayed version of the full swing signal at node 1012, is high, causing node 1016 (i.e., the precharge signal) to stay high.

After some time, the output pointer signal pulse arrives on conductor 1012. With reference to FIG. 103B, the low-to-high transition of the signal is marked by reference number 1052 at time t0. After a predefined delay time (determined by the delay of inverting delay circuit 1004), node 1014 transitions from high to low (reference number 1054) at time t1. Node 1016 continues to stay high since node 1012 is high as node 1014 goes low.

At time t2, the output pointer signal goes away, i.e., transitions back from high to low. This is marked by reference number 1062 in FIG. 10B. The high-to-low transition of node 1012 causes node 1016 (the precharge signal) to go low (reference number 1056) since node 1014 is already low when node 1012 goes from high to low.

After a predefined delay time (determined by the delay of inverting delay circuit 1004), node 1014 transitions from low to high (reference number 1064) at time t3 due to the high-to-low transition of node 1012. This low-to-high transition of node 1014 is marked by reference number 1064 in FIG. 10B and causes node 1016 to go back to high (reference number 1066). Thus, a low precharge pulse is created at node for use by the data clocking circuit (such as that shown in FIG. 8).

The circuits of FIGS. 7, 8, and 10A may also be employed to implement a data clocking circuit, such as data clocking circuit 214 of FIG. 2, that is capable of receiving the full swing high frequency timing pulse stream and the full swing high frequency data stream and synchronizing the data stream with the timing stream to output the high frequency stream of synchronized data.

Figure 11:
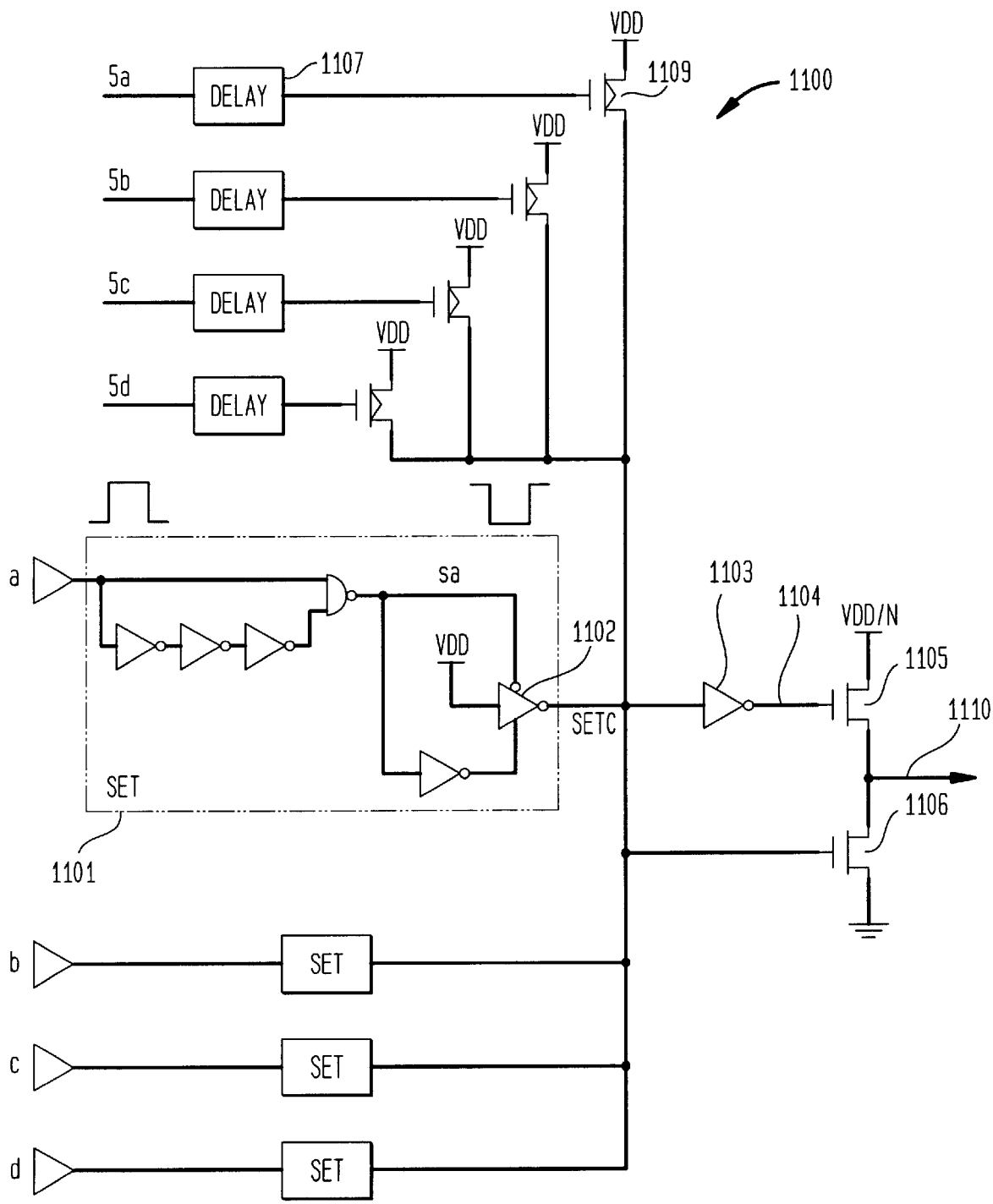
FIG. 11 illustrates, in accordance with another embodiment of the present invention, a detailed implementation of the time generator circuit of FIG. 2A that can output a high frequency timing pulse stream at reduced voltage levels from parallel timing signals operating at full swing voltages and lower frequency.

FIG. 11 illustrates, in accordance with another embodiment of the present invention, a timer generator circuit 1100, representing a detailed implementation of time generator circuit 206 of FIG. 2A that can output a high frequency timing pulse stream at reduced voltage levels from parallel timing signals operating at full swing voltages and lower frequency. As can be seen in FIG. 11, each input of the SET circuits 1101 is coupled to a full swing timing signals a, b, c and d. The output of SET circuit 1101 is SETc. SETc is at a high potential at the time the chip is powered-on. The operation of circuit 1100 is as follows. Initially full swing timing signals are at a ground potential or logic level '0'. When the timing signal a switches from logic level '0' to logic level '1', node sa will switch from logic level '1' to logic level '0'. This will enable the tri-state buffer labeled 1101 and its output, SETc, will switch to a logic level '0'. This will cause the gate of transistor 1105 to be at logic level '1'; it will conduct and pull the output node 1110 to the reduced voltage VDD/n. Note that a predetermined pulse width at node sa is generated by the rising edge of node a. Also note that when sa pulses to a logic level '0', this signal will pass through the delay circuit 1107 and arrive at the gate of transistor 1109 after a predetermined time. This will cause transistor 1109 to conduct and charge node SETc to a high potential, VDD. This will cause transistor 1106 to conduct and discharge the timer output to ground or logic level '0' terminating the time pulse generation. Subsequent rising edges of signals a, b, c, or d will repeat the signal generation.

Figure 12:
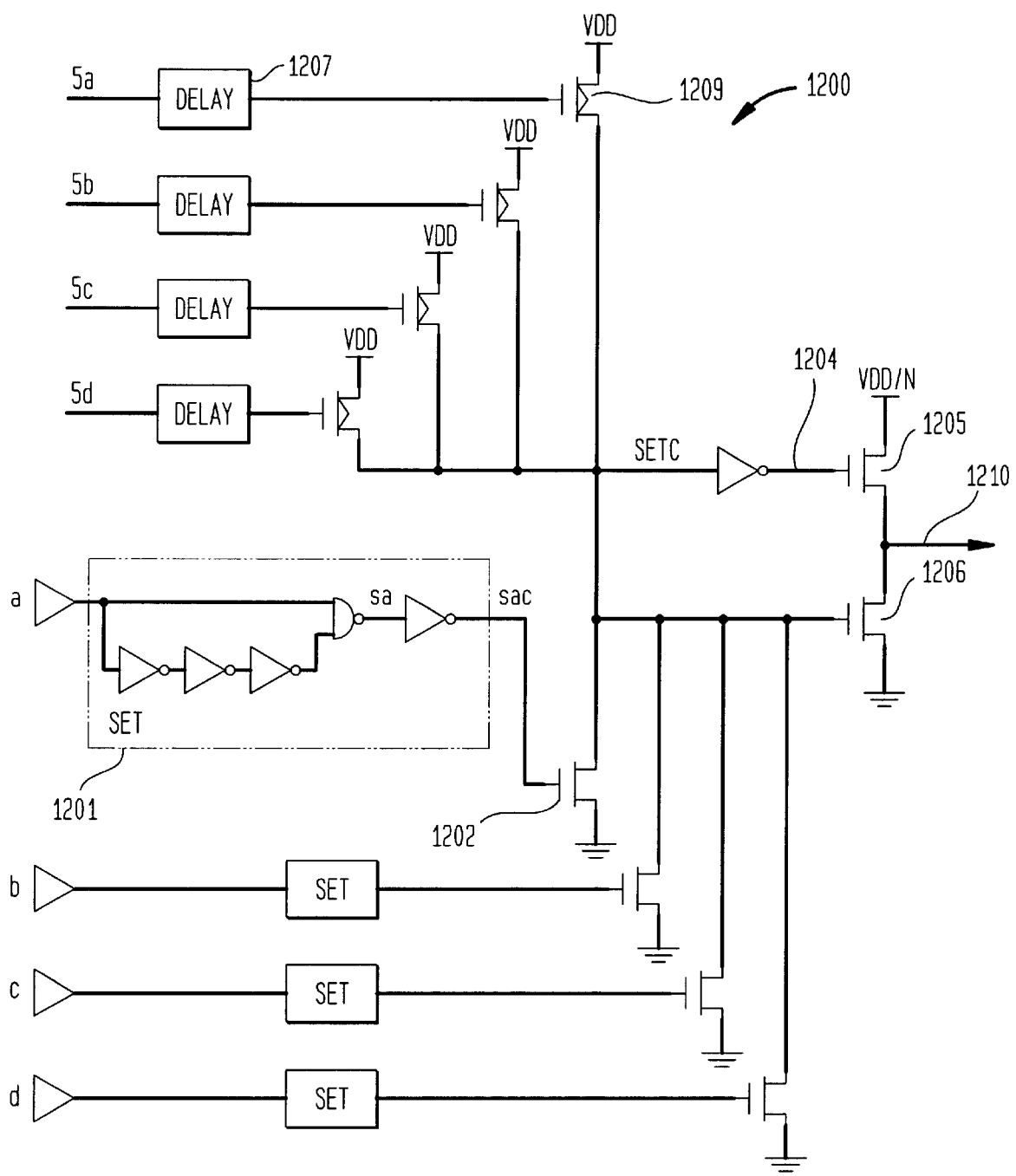
FIG. 12 illustrates, in accordance with another embodiment of the present invention, another detailed implementation of time generator circuit 206 of FIG. 2A that can output a high frequency timing pulse stream at reduced voltage levels from parallel timing signals operating at full swing voltages and lower frequency.

FIG. 12 illustrates, in accordance with another embodiment of the present invention, a timer generator circuit 1200, representing a detailed implementation of time generator circuit 206 of FIG. 2A that can output a high frequency timing pulse stream at reduced voltage levels from parallel timing signals operating at full swing voltages and lower frequency. As can be seen in FIG. 12, each input of the SET circuits 1201 is coupled to a full swing timing signals a, b, c and d. The output of SET circuit 1201 is coupled through a transistor to SETc. SETc is at a high potential at the time the chip is powered-on. The operation of circuit 1200 is as follows. Initially full swing timing signals are at a ground potential or logic level '0'. When the timing signal a switches from logic level '0'; to logic level '1', node sa will switch from logic level '1' to logic level '0'. This will cause transistor 1202 to conduct and its drain terminal, SETc, will switch to a logic level '0This will cause the gate of transistor 1205 to be at logic level '1'; it will conduct and pull the output node 1210 to the reduced voltage VDD/n. Note that a predetermined pulse width at node sa is generated by the rising edge of node a. Also note that when sa pulses to a logic level '0', this signal will pass through the delay circuit 1207 and arrive at the gate of transistor 1209 after a predetermined time. This will cause transistor 1209 to conduct and charge node SETc to a high potential, VDD. This will cause transistor 1206 to conduct and discharge the timer output to ground or logic level '0' terminating the timing pulse generation. Subsequent rising edges of signals a, b, c, or d will repeat the signal generation.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In an integrated circuit, a synchronized data capture circuit configured to synchronize capturing of data in a first plurality of data signals with a first plurality of timing signals to output a synchronized data capture signal, comprising:

a timer generator having a first timer generator output, said timer generator being coupled to receive said first plurality of timing signals and to serially output on said first timer generator output, as a first high frequency timing pulse stream, first timing pulses responsive to timing pulses of said plurality of timing signals, said first high frequency timing pulse stream having a timing pulse stream frequency that is higher than a timing input frequency associated with one of said first plurality of timing signals;

a first plurality of data driver circuits coupled to receive said first plurality of data signals and said plurality of timing signals, said first plurality of data driver circuits are configured to serially output, as a first high frequency data stream, first data pulses responsive to said timing pulses of said plurality of timing signals and data pulses of said first plurality of data signals; said first high frequency data stream having a data stream frequency that is higher than a data input frequency associated with one of said first plurality of data signals; and a first data clocking circuit coupled to receive said first high frequency data stream and said first high frequency timing pulse stream to synchronize capture of data in said first high frequency data stream using said first high frequency timing pulse stream to output said synchronized data capture signal, wherein said synchronized data capture signal has a data output frequency that is higher than said timing input frequency and said data input frequency.

2. The synchronized data capture circuit of claim 1 wherein said first high frequency data stream is transmitted as a full swing data signal.

3. The synchronized data capture circuit of claim 1 wherein said first high frequency data stream is transmitted as a reduced voltage data signal, said reduced voltage data signal having a reduced voltage level that is lower than a voltage level associated with said first plurality of data signals.

4. The synchronized data capture circuit of claim 3 wherein said first high frequency timing pulse stream is transmitted as a reduced voltage timing signal, said reduced voltage timing signal having said reduced voltage level.

5. The synchronized data capture of claim 4 wherein said timer generator includes a first NOR gate having a first NOR output and a first plurality of NOR inputs, said first plurality of NOR inputs are coupled to receive said first plurality of timing signals;

a first inverter having a first inverter input and a first inverter output, said first inverter input being coupled to said NOR output;

a first nFET having a first nFET gate, a first nFET drain, and a first nFET source, said first nFET gate being coupled to said first inverter output, a first one of said first nFET drain and said first nFET source being coupled to a reduced voltage source having said reduced voltage level;

a second nFET having a second nFET gate, a second nFET drain, and a second nFET source, said second nFET gate being coupled to said first NOR output, a first one of said second nFET drain and said second nFET source being coupled to ground; and an output node configured to output said first high frequency timing pulse stream, said output node being coupled to another one of said second nFET drain and said second nFET source as well as to another one of said first nFET drain and said first nFET source.

6. The synchronized data capture circuit of claim 3 wherein a given data driver circuit of said first plurality of data driver circuits include a latching stage having a latching stage input and a latching stage output, said latching stage input being configured to latch a given data signal of said first plurality of data signals and to output a latched signal at said latching stage output;

a control stage having a first and second control stage inputs and control stage outputs, said first control stage input being coupled to receive said latched signal, said second control stage input being coupled to receive a given timing signal of said first plurality of timing signals, said control stage being configured to output, responsive to said latched signal and said given timing signal, control stage signals at said control stage outputs;

a reduced voltage data driver stage having data driver inputs and a data driver output, said data driver inputs being coupled to receive said control stage signals, said data driver output outputting, responsive to said control stage signals, said first high frequency data stream, wherein said control stage signals have a voltage level that is higher than said reduced voltage level.

7. The synchronized data capture circuit of claim 6 wherein said control stage includes a first inverter having a first inverter input and a first inverter output, said first inverter input being coupled to receive said latched signal, a first inverting tri-state buffer having a first inverting tri-state buffer input and a first inverting tri-state buffer output, said first inverting tri-state buffer input being coupled to said first inverter output, said first inverting tri-state buffer being controlled by said given timing signal;

a second inverting tri-state buffer having a second inverting tri-state buffer input and a second inverting tri-state buffer output, said second inverting tri-state buffer input being coupled to receive said latched signal, said second inverting tri-state buffer also being controlled by said given timing signal;

a first nFET having a first n-FET gate, a first nFET drain, and a first nFET source, said first nFET gate being coupled to a complement one of said given timing signal, a first one of said first nFET drain and said first nFET source being coupled to ground;

a second nFET having a second n-FET gate, a second nFET drain, and a second nFET source, said second nFET gate being coupled to a complement one of said given timing signal, a first one of said second nFET drain and said second nFET source being coupled to ground;

a first control stage output coupled to said first inverting tri-state buffer output and another one of said first nFET drain and said first nFET source; and a second control stage output coupled to said second inverting tri-state buffer output and another one of said second nFET drain and said second nFET source.

8. The synchronized data capture circuit of claim 6 wherein said reduced voltage data driver stage includes a first nFET having a first nFET gate, a first nFET drain, and a first nFET source, said first nFET gate being coupled to a first one of said data driver inputs, a first one of said first nFET drain and said first nFET source being coupled to a reduced voltage source having said reduced voltage level;

a second nFET having a second nFET gate, a second nFET drain, and a second nFET source, said second nFET gate being coupled to a second one of said data driver inputs, a first one of said second nFET drain and said second nFET source being coupled to ground, wherein said data driver output is coupled to another one of said second nFET drain and said second nFET source as well as to another one of said first nFET drain and said first nFET source.

9. The synchronized data capture circuit of claim 3 wherein said synchronized data capture signal represents a full swing data signal, said full swing data signal having a full swing voltage level that is higher than said reduced voltage level.

10. The synchronized data capture circuit of claim 9 wherein voltage levels associated with said first plurality of data signals are higher than said reduced voltage level.

11. The synchronized data capture circuit of claim 3 wherein voltage levels associated with said first plurality of data signals are higher than said reduced voltage level.

12. The synchronized data capture circuit of claim 3 wherein said timing pulse stream frequency associated with said first high frequency timing pulse stream is approximately equal to said data stream frequency associated with said first high frequency data stream.

13. The synchronized data capture circuit of claim 12 wherein said data output frequency is approximately equal to said data stream frequency associated with said first high frequency data stream.

14. The synchronized data capture circuit of claim 1 wherein said first high frequency timing pulse stream is transmitted as a reduced voltage timing signal, said reduced voltage timing signal having a reduced voltage level that is lower than a voltage level associated with said first plurality of timing signals.

15. The synchronized data capture circuit of claim 1 wherein said integrated circuit represents an integrated memory circuit.

16. In an integrated circuit, a synchronized data capture circuit configured to synchronize capturing of data in a first plurality of data signals with a first plurality of timing signals to output a synchronized data capture signal, comprising:

a timer generator having a first timer generator output, said timer generator being coupled to receive said first plurality of timing signals and to serially output on said first timer generator output, as a first high frequency timing pulse stream, first timing pulses responsive to timing pulses of said plurality of timing signals, said first high frequency timing pulse stream having a timing pulse stream frequency that is higher than a timing input frequency associated with one of said first plurality of timing signals;

a first plurality of data driver circuits coupled to receive a first subset of data signals and said plurality of timing signals, said first subset of data signals representing a first subset of said first plurality of data signals, said first plurality of data driver circuits are configured to serially output, as a first high frequency data stream, first data pulses responsive to said timing pulses of said plurality of timing signals and data pulses of said first subset of data signals; said first high frequency data stream having a first data stream frequency that is higher than a data input frequency associated with one of said first plurality of data signals;

a second plurality of data driver circuits coupled to receive a second subset of data signals and said plurality of timing signals, said second subset of data signals representing a second subset of said first plurality of data signals, said second plurality of data driver circuits are configured to serially output, as a second high frequency data stream, second data pulses responsive to said timing pulses of said plurality of timing signals and data pulses of said second subset of data signals; said second high frequency data stream having a second data stream frequency that is higher than said data input frequency;

a first data clocking circuit coupled to receive said first high frequency data stream and said first high frequency timing pulse stream to synchronize capture of data in said first high frequency data stream using said first high frequency timing pulse stream to output first data capture signal;

a second data clocking circuit coupled to receive said second high frequency data stream and said first high frequency timing pulse stream to synchronize capture of data in said second high frequency data stream using said first high frequency timing pulse stream to output second data capture signal in an interleaved manner with said first data capture signal, wherein said synchronized data capture signal is formed from said first data capture signal and said second data capture signal with pulses from said first data capture signal interleaved in time with pulses from said second data signal.

17. The synchronized data capture circuit of claim 16 wherein said integrated circuit represents an integrated memory circuit.

18. The synchronized data capture circuit of claim 16 wherein said first high frequency data stream is transmitted as a full swing data signal.

19. The synchronized data capture circuit of claim 16 wherein said first high frequency data stream is transmitted as a reduced voltage data signal, said reduced voltage data signal having a reduced voltage level that is lower than a voltage level associated with said first plurality of data signals.

20. The synchronized data capture circuit of claim 19 wherein said first high frequency timing pulse stream is transmitted as a reduced voltage timing signal, said reduced voltage timing signal having said reduced voltage level.

21. The synchronized data capture of claim 20 wherein said timer generator includes a first NOR gate having a first NOR output and a first plurality of NOR inputs, said first plurality of NOR inputs are coupled to receive said first plurality of timing signals;

a first inverter having a first inverter input and a first inverter output, said first inverter input being coupled to said NOR output;

a first nFET having a first nFET gate, a first nFET drain, and a first nFET source, said first nFET gate being coupled to said first inverter output, a first one of said first nFET drain and said first nFET source being coupled to a reduced voltage source having said reduced voltage level;

a second nFET having a second nFET gate, a second nFET drain, and a second nFET source, said second nFET gate being coupled to said first NOR output, a first one of said second nFET drain and said second nFET source being coupled to ground; and an output node configured to output said first high frequency timing pulse stream, said output node being coupled to another one of said second nFET drain and said second nFET source as well as to another one of said first nFET drain and said first nFET source.

22. The synchronized data capture circuit of claim 19 wherein a given data driver circuit of said first plurality of data driver circuits include
   a latching stage having a latching stage input and a latching stage output, said latching stage input being configured to latch a given data signal of said first plurality of data signals and to output a latched signal at said latching stage output;
   a control stage having a first and second control stage inputs and control stage outputs, said first control stage input being coupled to receive said latched signal, said second control stage input being coupled to receive a given timing signal of said first plurality of timing signals, said control stage being configured to output, responsive to said latched signal and said given timing signal, control stage signals at said control stage outputs;
   a reduced voltage data driver stage having data driver inputs and a data driver output, said data driver inputs being coupled to receive said control stage signals, said data driver output outputting, responsive to said control stage signals, said first high frequency data stream, wherein said control stage signals have a voltage level that is higher than said reduced voltage level.

23. The synchronized data capture circuit of claim 22 wherein said control stage includes
   a first inverter having a first inverter input and a first inverter output, said first inverter input being coupled to receive said latched signal,
   a first inverting tri-state buffer having a first inverting tri-state buffer input and a first inverting tri-state buffer output, said first inverting tri-state buffer input being coupled to said first inverter output, said first inverting tri-state buffer being controlled by said given timing signal;
   a second inverting tri-state buffer having a second inverting tri-state buffer input and a second inverting tri-state buffer output, said second inverting tri-state buffer input being coupled to receive said latched signal, said second inverting tri-state buffer also being controlled by said given timing signal;
   a first nFET having a first n-FET gate, a first nFET drain, and a first nFET source, said first nFET gate being coupled to a complement one of said given timing signal, a first one of said first nFET drain and said first nFET source being coupled to ground;
   a second nFET having a second n-FET gate, a second nFET drain, and a second nFET source, said second nFET gate being coupled to a complement one of said given timing signal, a first one of said second nFET drain and said second nFET source being coupled to ground;
   a first control stage output coupled to said first inverting tri-state buffer output and another one of said first nFET drain and said first nFET source; and
   a second control stage output coupled to said second inverting tri-state buffer output and another one of said second nFET drain and said second nFET source.

24. The synchronized data capture circuit of claim 22 wherein said reduced voltage data driver stage includes
   a first nFET having a first nFET gate, a first nFET drain, and a first nFET source, said first nFET gate being coupled to a first one of said data driver inputs, a first one of said first nFET drain and said first nFET source being coupled to a reduced voltage source having said reduced voltage level;
   a second nFET having a second nFET gate, a second nFET drain, and a second nFET source, said second nFET gate being coupled to a second one of said data driver inputs, a first one of said second nFET drain and said second nFET source being coupled to ground, wherein said data driver output is coupled to another one of said second nFET drain and said second nFET source as well as to another one of said first nFET drain and said first nFET source.

25. The synchronized data capture circuit of claim 19 wherein said synchronized data capture signal represents a full swing data signal, said full swing data signal having a full swing voltage level that is higher than said reduced voltage level.

26. The synchronized data capture circuit of claim 25 wherein voltage levels associated with said first plurality of data signals are higher than said reduced voltage level.

27. The synchronized data capture circuit of claim 19 wherein said integrated circuit represents an integrated memory circuit.

28. The synchronized data capture circuit of claim 19 wherein voltage levels associated with said first plurality of data signals are higher than said reduced voltage level.

29. The synchronized data capture circuit of claim 19 wherein said timing pulse stream frequency associated with said first high frequency timing pulse stream is approximately equal to said data stream frequency associated with said first high frequency data stream.

30. The synchronized data capture circuit of claim 29 wherein said data output frequency is approximately equal to said data stream frequency associated with said first high frequency data stream.

31. The synchronized data capture circuit of claim 16 wherein said first high frequency timing pulse stream is transmitted as a reduced voltage timing signal, said reduced voltage timing signal having a reduced voltage level that is lower than a voltage level associated with said first plurality of timing signals.

32. In an integrated circuit, a synchronized data capture circuit configured to synchronize capturing of data in a first plurality of data signals with a first plurality of timing signals to output a synchronized data capture signal, comprising:
   a first timer generator having a first timer generator output, said first timer generator being coupled to receive a first subset of timing signals, said first subset of timing signals representing a first subset of said first plurality of timing signals, and to serially output on said first timer generator output, as a first high frequency timing pulse stream, first timing pulses responsive to timing pulses of said first subset of timing signals, said first high frequency timing pulse stream having a first timing pulse stream frequency that is higher than a timing input frequency associated with one of said first plurality of timing signals;
   a second timer generator having a second timer generator output, said second timer generator being coupled to receive a second subset of timing signals, said second subset of timing signals representing a second subset of said first plurality of timing signals, and to serially output on said second timer generator output, as a second high frequency timing pulse stream, second timing pulses responsive to timing pulses of said second subset of timing signals, said second high frequency timing pulse stream having a second timing pulse stream frequency that is higher than said timing input frequency, wherein pulses of said first high frequency timing pulse stream are interleaved in time with pulses of said second high frequency timing pulse stream;

a first plurality of data driver circuits coupled to receive a first subset of data signals and said plurality of timing signals, said first subset of data signals representing a first subset of said first plurality of data signals, said first plurality of data driver circuits are configured to serially output, as a first high frequency data stream, first data pulses responsive to said timing pulses of said plurality of timing signals and data pulses of said first subset of data signals; said first high frequency data stream having a first data stream frequency that is higher than a data input frequency associated with one of said first plurality of data signals;

a second plurality of data driver circuits coupled to receive a second subset of data signals and said plurality of timing signals, said second subset of data signals representing a second subset of said first plurality of data signals, said second plurality of data driver circuits are configured to serially output, as a second high frequency data stream, second data pulses responsive to said timing pulses of said plurality of timing signals and data pulses of said second subset of data signals; said second high frequency data stream having a second data stream frequency that is higher than said data input frequency;

a first data clocking circuit coupled to receive said first high frequency data stream, said first high frequency timing pulse stream, and said second high frequency timing pulse stream to synchronize capture of data in said first high frequency data stream using said first high frequency timing pulse stream and said second high frequency timing pulse stream to output first data capture signal;

a second data clocking circuit coupled to receive said second high frequency data stream, said first high frequency timing pulse stream, and said second high frequency timing pulse stream to synchronize capture of data in said second high frequency data stream using said first high frequency timing pulse stream and said second high frequency timing pulse stream to output, in an interleaved manner with said first data capture signal, a second data capture signal, wherein said synchronized data capture signal is formed from said first data capture signal and said second data capture signal with pulses from said first data capture signal interleaved with pulses from said second data signal.

33. The synchronized data capture circuit of claim 32 wherein said integrated circuit represents an integrated memory circuit.

34. The synchronized data capture circuit of claim 32 wherein said first high frequency data stream is transmitted as a full swing data signal.

35. The synchronized data capture circuit of claim 32 wherein said first high frequency data stream is transmitted as a reduced voltage data signal, said reduced voltage data signal having a reduced voltage level that is lower than a voltage level associated with said first plurality of data signals.

36. The synchronized data capture circuit of claim 35 wherein said first high frequency timing pulse stream is transmitted as a reduced voltage timing signal, said reduced voltage timing signal having said reduced voltage level.

37. The synchronized data capture of claim 36 wherein said first timer generator includes a first NOR gate having a first NOR output and a first plurality of NOR inputs, said first plurality of NOR inputs are coupled to receive said first plurality of timing signals;

a first inverter having a first inverter input and a first inverter output, said first inverter input being coupled to said NOR output;

a first nFET having a first nFET gate, a first nFET drain, and a first nFET source, said first nFET gate being coupled to said first inverter output, a first one of said first nFET drain and said first nFET source being coupled to a reduced voltage source having said reduced voltage level;

a second nFET having a second nFET gate, a second nFET drain, and a second nFET source, said second nFET gate being coupled to said first NOR output, a first one of said second nFET drain and said second nFET source being coupled to ground; and an output node configured to output said first high frequency timing pulse stream, said output node being coupled to another one of said second nFET drain and said second nFET source as well as to another one of said first nFET drain and said first nFET source.

38. The synchronized data capture circuit of claim 35 wherein a given data driver circuit of said first plurality of data driver circuits include a latching stage having a latching stage input and a latching stage output, said latching stage input being configured to latch a given data signal of said first plurality of data signals and to output a latched signal at said latching stage output;

a control stage having a first and second control stage inputs and control stage outputs, said first control stage input being coupled to receive said latched signal, said second control stage input being coupled to receive a given timing signal of said first plurality of timing signals, said control stage being configured to output, responsive to said latched signal and said given timing signal, control stage signals at said control stage outputs;

a reduced voltage data driver stage having data driver inputs and a data driver output, said data driver inputs being coupled to receive said control stage signals, said data driver output outputting, responsive to said control stage signals, said first high frequency data stream, wherein said control stage signals have a voltage level that is higher than said reduced voltage level.

39. The synchronized data capture circuit of claim 38 wherein said control stage includes a first inverter having a first inverter input and a first inverter output, said first inverter input being coupled to receive said latched signal, a first inverting tri-state buffer having a first inverting tri-state buffer input and a first inverting tri-state buffer output, said first inverting tri-state buffer input being coupled to said first inverter output, said first inverting tri-state buffer being controlled by said given timing signal;

a second inverting tri-state buffer having a second inverting tri-state buffer input and a second inverting tri-state buffer output, said second inverting tri-state buffer input being coupled to receive said latched signal, said second inverting tri-state buffer also being controlled by said given timing signal;

a first nFET having a first n-FET gate, a first nFET drain, and a first nFET source, said first nFET gate being coupled to a complement one of said given timing signal, a first one of said first nFET drain and said first nFET source being coupled to ground;

a second nFET having a second n-FET gate, a second nFET drain, and a second nFET source, said second nFET gate being coupled to a complement one of said given timing signal, a first one of said second nFET drain and said second nFET source being coupled to ground;

a first control stage output coupled to said first inverting tri-state buffer output and another one of said first nFET drain and said first nFET source; and a second control stage output coupled to said second inverting tri-state buffer output and another one of said second nFET drain and said second nFET source.

40. The synchronized data capture circuit of claim 38 wherein said reduced voltage data driver stage includes a first nFET having a first nFET gate, a first nFET drain, and a first nFET source, said first nFET gate being coupled to a first one of said data driver inputs, a first one of said first nFET drain and said first nFET source being coupled to a reduced voltage source having said reduced voltage level;

a second nFET having a second nFET gate, a second nFET drain, and a second nFET source, said second nFET gate being coupled to a second one of said data driver inputs, a first one of said second nFET drain and said second nFET source being coupled to ground, wherein said data driver output is coupled to another one of said second nFET drain and said second nFET source as well as to another one of said first nFET drain and said first nFET source.

41. The synchronized data capture circuit of claim 35 wherein said synchronized data capture signal represents a full swing data signal, said full swing data signal having a full swing voltage level that is higher than said reduced voltage level.

42. The synchronized data capture circuit of claim 41 wherein voltage levels associated with said first plurality of data signals are higher than said reduced voltage level.

43. The synchronized data capture circuit of claim 35 wherein said integrated circuit represents an integrated memory circuit.

44. The synchronized data capture circuit of claim 35 wherein voltage levels associated with said first plurality of data signals are higher than said reduced voltage level.

45. The synchronized data capture circuit of claim 35 wherein said timing pulse stream frequency associated with said first high frequency timing pulse stream is approximately equal to said data stream frequency associated with said first high frequency data stream.

46. The synchronized data capture circuit of claim 45 wherein said data output frequency is approximately equal to said data stream frequency associated with said first high frequency data stream.

47. The synchronized data capture circuit of claim 32 wherein said first high frequency timing pulse stream is transmitted as a reduced voltage timing signal, said reduced voltage timing signal having a reduced voltage level that is lower than a voltage level associated with said first plurality of timing signals.

* * * * *